US012356806B2

(12) United States Patent
Lee et al.

(10) Patent No.: US 12,356,806 B2
(45) Date of Patent: Jul. 8, 2025

(54) DISPLAY PANEL HAVING A PARTITION WALL AND AN OPENING AREA, AND ELECTRONIC APPARATUS INCLUDING THE SAME

(71) Applicant: Samsung Display Co., Ltd., Yongin-Si (KR)

(72) Inventors: Jeongho Lee, Yongin-si (KR); Swaehyun Kim, Yongin-si (KR); Youhan Moon, Yongin-si (KR); Jaehong Park, Yongin-si (KR); Minseok Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 563 days.

(21) Appl. No.: 17/742,203

(22) Filed: May 11, 2022

(65) Prior Publication Data

US 2023/0050210 A1     Feb. 16, 2023

(30) Foreign Application Priority Data

Aug. 12, 2021   (KR) .................. 10-2021-0106937

(51) Int. Cl.
*H01L 27/32*    (2006.01)
*H01L 51/52*    (2006.01)
(Continued)

(52) U.S. Cl.
CPC ......... *H10K 59/124* (2023.02); *H10K 50/844* (2023.02); *H10K 71/00* (2023.02); *H10K 59/1201* (2023.02)

(58) Field of Classification Search
CPC .. H10K 59/124; H10K 50/844; H10K 59/873; H10K 59/121
See application file for complete search history.

(56) References Cited

U.S. PATENT DOCUMENTS 10,205,122 B2    2/2019    Choi et al.
10,466,822 B2    11/2019   Kim et al.
(Continued)

FOREIGN PATENT DOCUMENTS

KR    20160040345 A    *    4/2016
KR    10-2017-0059864 A    5/2017
(Continued)

OTHER PUBLICATIONS

Tani et al., 1020160040345, machine translation Apr. 2016 (Year: 2016).*
Choi 10-2020-0030163, machine translation (Year: 2020).*

*Primary Examiner* — Tracie Y Green
(74) *Attorney, Agent, or Firm* — Innovation Counsel LLP

(57) ABSTRACT

Provided are a display panel and an electronic apparatus including the display panel. The display panel includes: a substrate having an opening; a plurality of light-emitting elements in a display area, the plurality of light-emitting elements including an intermediate layer; a plurality of partition walls in an intermediate area between the display area and the opening; at least one insulating layer positioned between the plurality of partition walls and the substrate; wherein the intermediate layer further includes an organic material layer extending toward the intermediate area from the display area, the organic material layer being separated by a plurality of first opening portions in the intermediate area, and the at least one insulating layer has a plurality of opening portions overlapping the plurality of first opening portions.

20 Claims, 21 Drawing Sheets

(51) Int. Cl.
  *H01L 51/56*    (2006.01)
  *H10K 50/844*   (2023.01)
  *H10K 59/124*   (2023.01)
  *H10K 71/00*    (2023.01)
  *H10K 59/12*    (2023.01)

(56) References Cited

U.S. PATENT DOCUMENTS

| | | |
|---|---|---|
| 10,644,087 B2 | 5/2020 | Lee et al. |
| 10,741,788 B2 | 8/2020 | Won et al. |
| 10,957,877 B2 | 3/2021 | Jang et al. |
| 11,139,451 B2 | 10/2021 | Choi et al. |
| 11,387,432 B2 | 7/2022 | Lee et al. |
| 2017/0237038 A1* | 8/2017 | Kim .................. H10K 59/873 257/40 |
| 2020/0127233 A1* | 4/2020 | Sung .................. H10K 59/121 |
| 2020/0176709 A1* | 6/2020 | Moon .................. H10K 59/131 |
| 2020/0257162 A1* | 8/2020 | Lee .................... H10K 59/8792 |
| 2021/0175297 A1* | 6/2021 | Kim .................... H10K 59/353 |

FOREIGN PATENT DOCUMENTS

| | | |
|---|---|---|
| KR | 10-2018-0063633 A | 6/2018 |
| KR | 10-2019-0074088 A | 6/2019 |
| KR | 10-2019-0096467 A | 8/2019 |
| KR | 20200030163 A * | 3/2020 |
| KR | 10-2020-0060594 A | 6/2020 |
| KR | 10-2020-0073544 A | 6/2020 |
| KR | 10-2020-0113092 A | 10/2020 |
| KR | 10-2196085 B1 | 12/2020 |

\* cited by examiner

DISPLAY PANEL HAVING A PARTITION WALL AND AN OPENING AREA, AND ELECTRONIC APPARATUS INCLUDING THE SAME

CROSS-REFERENCE TO RELATED APPLICATION

This application claims priority under 35 U.S.C. § 119 to Korean Patent Application No. 10-2021-01 06937 filed on Aug. 12, 2021 in the Korean Intellectual Property Office; the Korean Patent Application is incorporated by reference.

BACKGROUND

1. Field

The technical field relates to a display panel and an electronic apparatus including the display panel.

2. Description of the Related Art

A display panel may display images in response to input signals. Display panels may be included in various electronic devices.

A display panel may include a display area for displaying images. The display area may be used for performing additional functions.

SUMMARY

One or more embodiments may be related to a display panel including at least one opening, a manufacturing method of the display panel, and an electronic apparatus that includes the display panel.

Additional aspects will be set forth in part in the description that follows and, in part, will be apparent from the description, or may be learned by practice of the embodiments of the present disclosure.

According to an embodiment, a display panel includes a substrate having an opening, a plurality of light-emitting elements in a display area around the opening, the plurality of light-emitting elements including a first electrode, a second electrode, and an intermediate layer between the first electrode and the second electrode, a plurality of partition walls in an intermediate area between the display area and the opening, at least one insulating layer below the plurality of partition walls, and an encapsulation layer on the plurality of light-emitting elements, the encapsulation layer including at least one inorganic encapsulation layer and an organic encapsulation layer, wherein the intermediate layer further includes an organic material layer extending toward the intermediate area from the display area, the organic material layer being separated by a plurality of first opening portions in the intermediate area, and the at least one insulating layer has a plurality of opening portions overlapping the plurality of first opening portions.

The display panel may further include a stopper layer below the organic material layer and above the at least one insulating layer, the stopper layer having a plurality of opening portions corresponding to the first opening portions.

The plurality of partition walls may include a first partition wall and a second partition wall, the first partition wall being closest to the display area, and the second partition wall being closer to the opening of the substrate than the first partition wall.

The second electrode may include a single second opening portion extending toward the intermediate area from the display area and located in the intermediate area, and an edge portion of the second electrode is located between the display area and the first partition wall, the edge portion of the second electrode defining an outline of the second opening portion.

The edge portion of the second electrode may overlap the organic encapsulation layer.

The second electrode may extend toward the intermediate area from the display area in the intermediate layer, the second electrode including a plurality of separation portions separated by a plurality of second opening portions in the intermediate area.

One edge portion of the plurality of separation portions may be located between the first partition wall and the second partition wall, and may overlap an organic insulating material portion.

The organic insulating material portion may include a same material as the organic encapsulation layer.

The display panel may further include a metal stack having an opening portion corresponding to the plurality of first opening portions.

The metal stack may include a plurality of metal layers on different layers from each other, and one of the plurality of metal layers may be below the at least one insulating layer.

According to an embodiment, an electronic apparatus includes a display panel including an opening area, a display area around the opening area, and an intermediate area between the opening area and the display area, and a component below the display panel to overlap the opening area, wherein the display panel includes a substrate having an opening in the opening area, a plurality of light-emitting elements in the display area, the plurality of light-emitting elements including a first electrode, a second electrode, and an intermediate layer between the first electrode and the second electrode, a first partition wall and a second partition wall in the intermediate area, at least one insulating layer below the first partition wall and the second partition wall, and an encapsulation layer on the plurality of light-emitting elements, the encapsulation layer comprising at least one inorganic encapsulation layer and an organic encapsulation layer, wherein the intermediate layer further includes an organic material layer extending toward the intermediate area from the display area, the organic material layer being separated by a plurality of first opening portions in the intermediate area, and the at least one insulating layer has a plurality of opening portions overlapping the plurality of first opening portions.

The display panel may further include a stopper layer below the organic material layer and above the at least one insulating layer, the stopper layer having a plurality of opening portions corresponding to the first opening portions.

The second electrode may include a single second opening portion extending toward the intermediate area from the display area and located in the intermediate area, the first partition wall and the second partition wall may be located in the single second opening portion, and an edge portion of the second electrode may be located between the display area and the first partition wall, the edge portion of the second electrode defining an outline of the single second opening portion.

The edge portion of the second electrode may overlap the organic encapsulation layer.

The second electrode may extend toward the intermediate area from the display area in the intermediate layer, the second electrode including a plurality of separation portions separated by a plurality of second opening portions in the intermediate area.

The plurality of separation portions of the second electrode may cover each of the first partition wall and the second partition wall.

One edge portion of the plurality of separation portions of the second electrode may be located between the first partition wall and the second partition wall, and overlap an organic insulating material portion, the organic insulating material portion including a same material as the organic encapsulation layer.

The display panel may further include a metal stack in the intermediate layer, the metal stack including a plurality of metal layers arranged on different layers from each other, and the metal stack may include opening portions corresponding to the plurality of first opening portions.

One of the plurality of metal layers may overlap one of the first partition wall and the second partition wall, the one of the plurality of metal layers having a width greater than a width of the partition wall that is overlapped thereby.

The component may include a speaker, a sensor, or a camera.

Other aspects, features, and advantages other than those described above will become apparent from the accompanying drawings, the appended claims, and the detailed description of the present disclosure.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
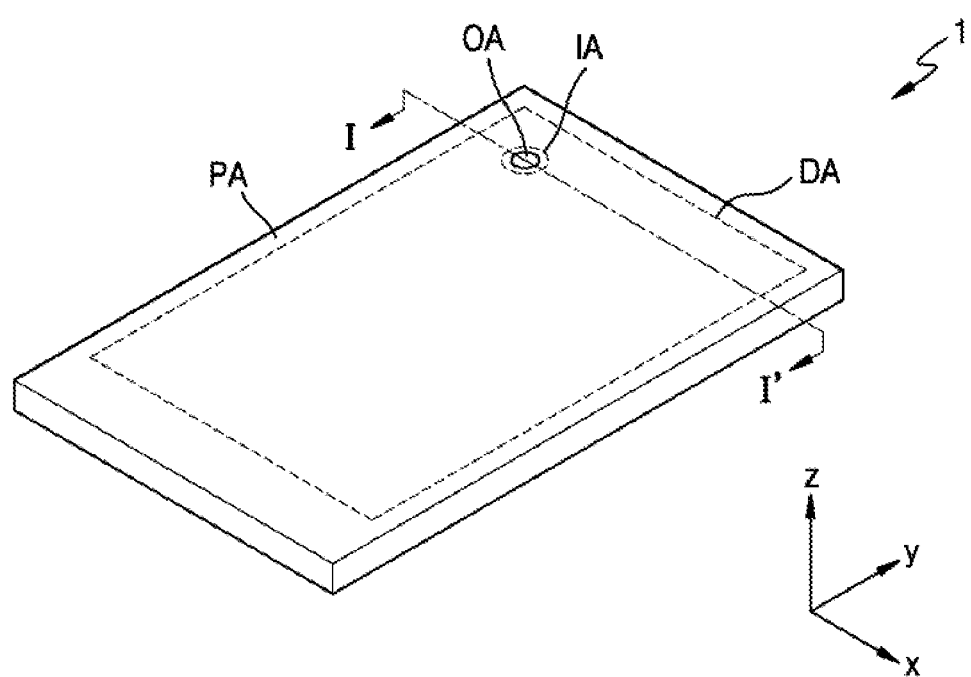
FIG. 1 is a perspective view schematically illustrating an electronic apparatus according to an embodiment.

Examples of embodiments are described with reference to the accompanying drawings. Like reference numerals may refer to like elements. The described embodiments have different forms and should not be construed as being limited to the description.

Although the terms "first," "second," etc. are used to describe various elements, the elements should not be limited by the terms. The terms may be used for distinguishing one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

An expression used in the singular form may encompass the plural form.

The terms "comprise," "comprising," "include" and/or "including" may specify the presence of stated features or components but may not preclude the addition of one or more other features or components.

When a first element is referred to as being "on" a second element, the first element can be directly or indirectly on the second element. Zero or more intervening elements may be present between the first element and the second element.

In the drawings, dimensions may be exaggerated or reduced for convenience of explanation and may not limit the embodiments.

When an embodiment may be implemented differently, a certain process order may be performed differently from the described order. For example, two consecutively described processes may be performed substantially at the same time or performed in an order opposite to the described order.

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" or "comprise" may mean "be made of." The term "adjacent" may mean "immediately adjacent." The expression that an element extends in a particular direction may mean that the element extends lengthwise in the particular direction and/or that the lengthwise direction of the element is in the particular direction. The term "pattern" may mean "member." The term "defined" may mean "formed" or "provided." The expression that a space or opening overlaps an object may mean that (the position of) the space or opening overlaps with (the position of) the object. The term "opening portion" may mean "opening" or "through hole." The term "edge portion" may mean "edge" or "edge structure." The term "shape" may mean "structure." A listing of materials/items may mean at least one of the listed materials/items. An "area" may mean the area of a substrate that corresponds to a certain area of the associated display panel. The term "display area" may mean the area of a substrate that corresponds to the display area of the associated display panel.

FIG. 1 is a perspective view schematically illustrating an electronic apparatus according to an embodiment.

Referring to FIG. 1, the electronic apparatus 1 may include an apparatus for displaying moving images and/or still images. The electronic apparatus 1 may be, for example, a television, a laptop computer, a monitor, an advertisement board, an Internet of things (IoT) device, a mobile phone, a smartphone, a tablet personal computer (tablet PC), a mobile communication terminal, an electronic organizer, an electronic book, a portable multimedia player (PMP), a navigation device, an ultra-mobile personal computer (UMPC), a smartwatch, a watchphone, a glasses-type display, a head-mounted display (HMD), an instrument panel for an automobile, a center fascia for an automobile, a center information display (CID) arranged on a dashboard, a display that replaces a side-view mirror of an automobile, or a display arranged on the backside of a front seat of an automobile. For convenience of explanation, in FIG. 1, the electronic apparatus 1 according to an embodiment is used as a smartphone.

The electronic apparatus 1 may have a rectangular shape in a plan view. For example, the electronic apparatus 1 may have a planar shape of a rectangle having short sides in an x-direction and long sides in a y-direction. 1. A corner where a short side meets a long side may be round or may be formed at a right angle. The planar shape of the electronic apparatus 1 is not limited to a rectangle, and may be formed in other polygons, an elliptical shape, or an irregular shape.

The electronic apparatus 1 may include an opening area OA (or a first area) and a display area DA (or a second area) at least partially surrounding the opening area OA. The electronic apparatus 1 may include an intermediate area IA (or a third area) and an outer area PA (or a fourth area). The intermediate area IA may be arranged between the opening area OA and the display area DA. The outer area PA may be outside the display area DA and may surround the display area DA.

The opening area OA may be arranged in the display area DA. In an embodiment. In some embodiments, the opening area OA may be arranged at a center part, an upper left part, or an upper right part of the display area DA. For example, "left" may refer to a −x direction, "right" may refer to a +x direction, "upper" may refer to a +y direction, and "lower" may refer to a −y direction. FIG. 1 shows that the opening area OA is provided in singularity; however, in another embodiment, the opening area OA may be provided in plurality.

Figure 2:
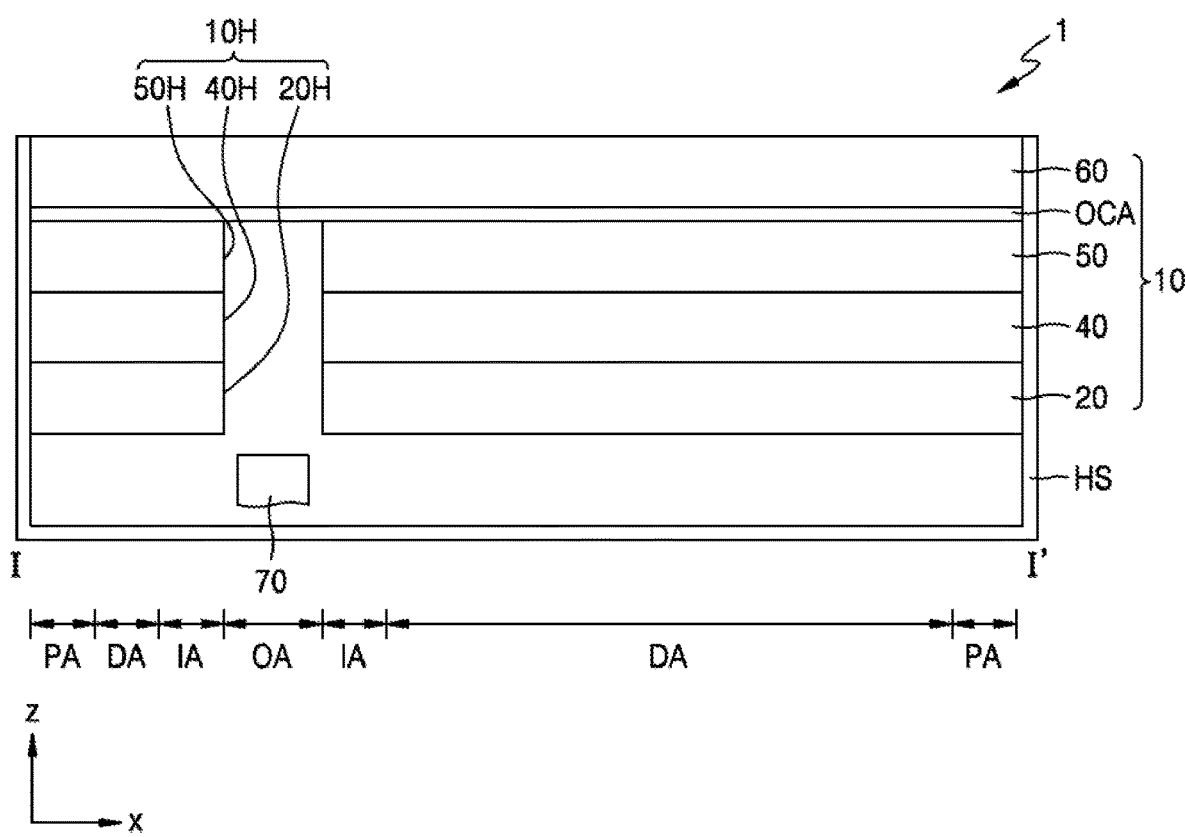
FIG. 2 is a cross-sectional view taken along line I-I' in FIG. 1 according to an embodiment.

FIG. 2 is a cross-sectional view taken along line I-I' in FIG. 1 according to an embodiment.

Referring to FIG. 2, the electronic apparatus 1 may include the display panel 10 and a component 70 arranged in the opening area OA. The display panel 10 and the component 70 may be accommodated in a housing HS.

The display panel 10 may include a display element layer 20, an input sensing layer 40, an optical functional layer 50, and a cover window 60.

The display element layer 20 may include display elements (or light-emitting elements) for emitting light to display an image. A display element may include a light-emitting diode, for example, an organic light-emitting diode including an organic emission layer.

The input sensing layer 40 may obtain coordinate information according to an external input, for example, a touch event. The input sensing layer 40 may include a sensing electrode (or a touch electrode) and trace lines connected to the sensing electrode. The input sensing layer 40 may be arranged on the display element layer 20. The input sensing layer 40 may sense an external input by a mutual capacitance method and/or a self-capacitance method.

The input sensing layer 40 may be provided directly on the display element layer 20 or may be separately formed and then coupled to the display element 20 through an adhesive layer such as an optical clear adhesive. The input sensing layer 40 may be immediately provided after a process of forming the display element layer 20, and no adhesive layer may be between the input sensing layer 40 and the display element layer 20. Although FIG. 2 shows that the input sensing layer 40 is between the display element layer 20 and the optical functional layer 50, the input sensing layer 40 may be arranged on the optical functional layer 50 in another embodiment.

The optical functional layer 50 may include an anti-reflection layer. The anti-reflection layer may reduce reflectivity of light (external light) incident toward the display panel 10 from the outside through the cover window 60. The anti-reflection layer may include a retarder and a polarizer. The retarder may include a film-type retarder or a liquid crystal-type retarder. The polarizer may include a film-type polarizer or a liquid crystal-type polarizer. The film-type polarizer may include a stretchable synthetic resin film, and the liquid crystal coating-type polarizer may include liquid crystals arranged in a certain array.

In another embodiment, the anti-reflection layer may include a black matrix and color filters. The color filters may be arranged based on colors of light emitted from the light-emitting diodes of the display element layer 20. In another embodiment, the anti-reflection layer may include a destructive interference structure. The destructive interference structure may include a first reflection layer and a second reflection layer respectively arranged on two different layers. First-reflected light and second-reflected light respectively reflected by the first reflection layer and the second reflection layer may destructively interfere; thus, the reflectivity of external light may be reduced.

The optical functional layer 50 may include a lens layer. The lens layer may improve the emission efficiency of light emitted from the display element layer 20 or reduce color deviation. The lens layer may include a layer having a concave or convex lens shape and/or may include a plurality of layers respectively having different refractive indices. The optical functional layer 50 may include the anti-reflection layer and/or the lens layer.

The display panel 10 may include an opening 10H. Regarding the above, FIG. 2 shows that the display element layer 20, the input sensing layer 40, and the optical functional layer 50 include first to third openings 20H, 40H, and 50H, respectively, and the first to third openings 20H, 40H, and 50H overlap each other.

The first opening 20H may extend to a bottom surface of the display element layer 20 from an upper surface of the display element layer 20. The second opening 40H may extend to a bottom surface of the input sensing layer 40 from an upper surface of the input sensing layer 40. The third opening 50H may extend to a bottom surface of the optical functional layer 50 from an upper surface of the optical functional layer 50.

The first to third openings 20H, 40H, and 50H, may overlap each other in the opening area OA. Sizes (or diameters) of the first to third openings 20H, 40H and 50H may be equal to or different from each other.

In another embodiment, at least one of the display element layer 20, the input sensing layer 40, and the optical functional layer 50 may not include an opening. For example, one or two of the display element layer 20, the input sensing layer 40, and the optical functional layer 50 may not include an opening.

The cover window 60 may be arranged on the optical functional layer 50. The cover window 60 may be coupled to the optical functional layer 50 through an adhesive layer such as an optical clear adhesive OCA. The cover window 60 may include a glass material or a plastic material. The plastic material may include polyethersulfone, polyacrylate, polyetherimide, polyethylene naphthalate, polyethylene terephthalate, polyphenylene sulfide, polyarylate, polyimide, polycarbonate, or cellulose acetate propionate.

The cover window 60 may include a flexible window. For example, the cover window 60 may include a polyimide window or an ultra-thin glass window.

The opening area OA may be a component area (e.g. a sensor area, a camera area, a speaker area, etc.) in which the component 70 for adding one or more functions to the electronic apparatus 1 is arranged. The component 70 may overlap and be exposed by the opening 10H of the display panel 10.

The component 70 may include an electronic element. The component 70 may include an electronic element using light or sound. The electronic element may include a sensor such as an infrared sensor using light, a camera for receiving light to capture an image, a sensor for outputting and sensing light or sound to measure a distance or recognize a fingerprint or the like, a miniature lamp for outputting light, or a speaker for outputting sound. The electronic element may use light of one or more predetermined wavelength bands such as visible light, infrared light, and ultraviolet light. The opening area OA may be/correspond to a transmission area through which light and/or sound output from the component 70 to the outside or progressing toward the component 70 from the outside may pass.

In another embodiment, when the electronic apparatus 1 is used as a smart watch or an instrument panel for automobiles, the component 70 may include a member including a clock hand or a needle for indicating certain information (e.g., vehicle speed). Unlike that shown in FIG. 1, the cover window 60 may include an opening in the opening area OA so that the component 70 such as a needle may be exposed to the outside. In some embodiments, even when the component 70 is a speaker, the cover window 60 may include an opening corresponding to the opening area OA.

Figure 3:
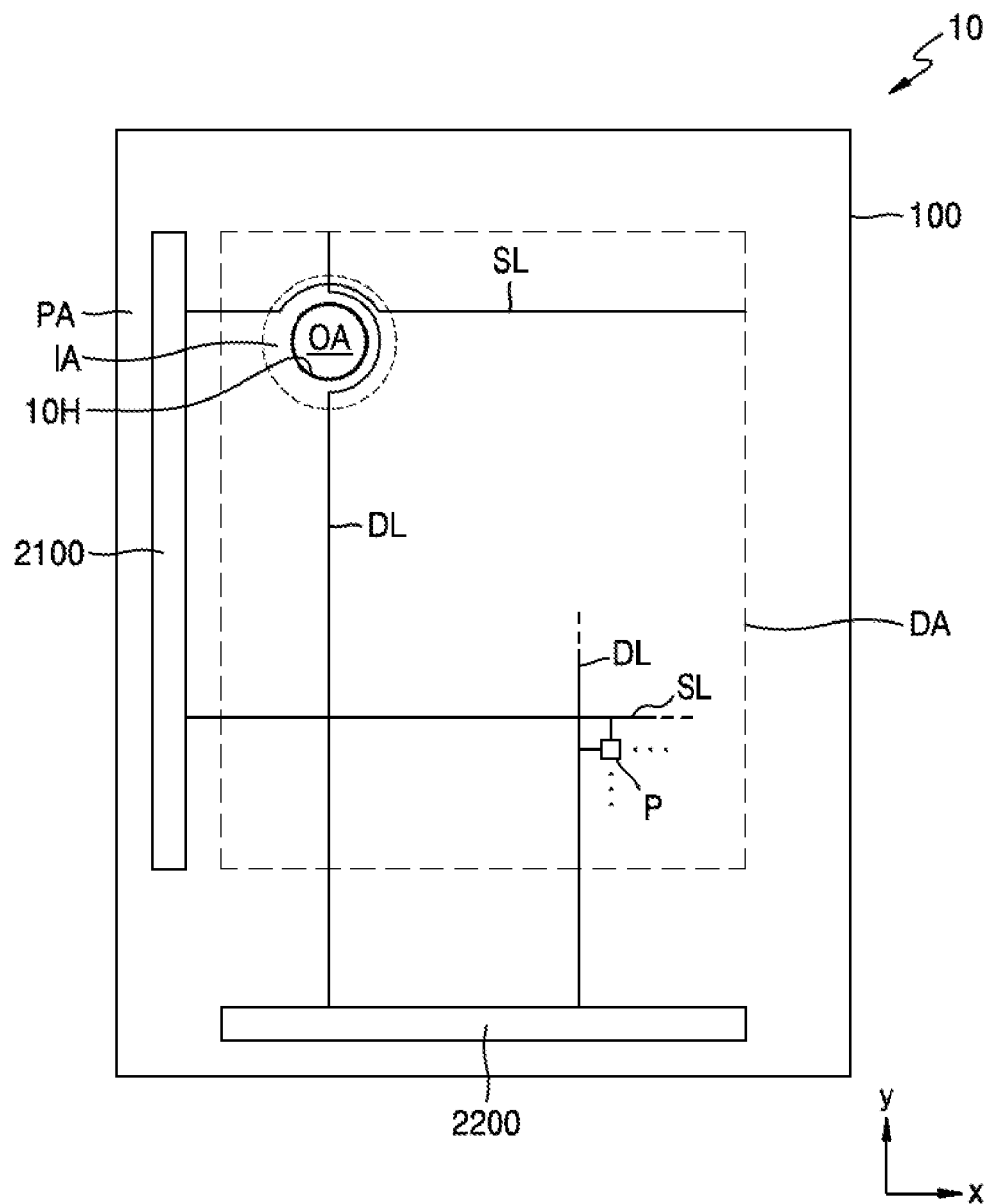
FIG. 3 is a plan view schematically illustrating a display panel according to an embodiment.
Figure 4:
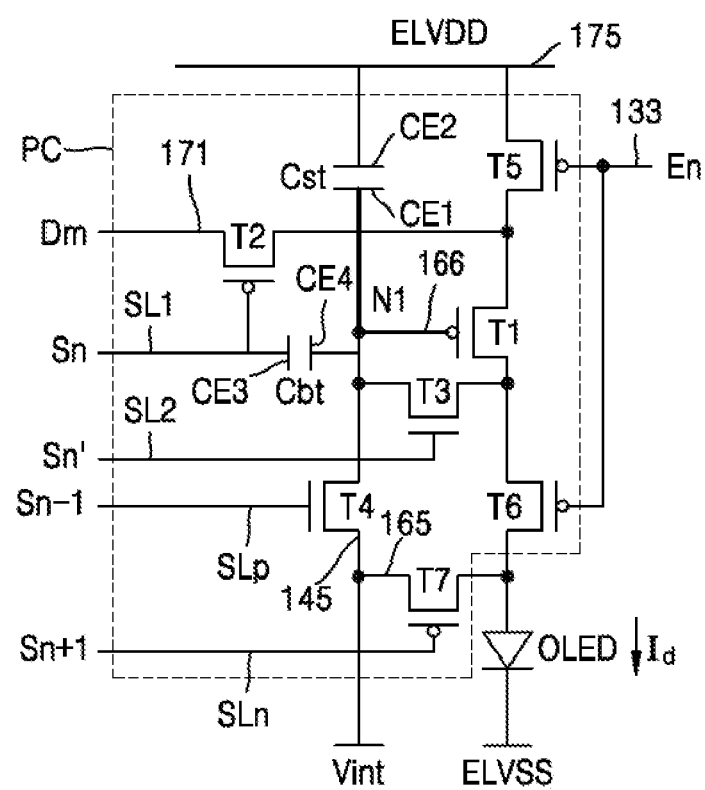
FIG. 4 illustrates an equivalent circuit connected to a light-emitting diode of a display panel according to an embodiment.

FIG. 3 is a plan view of a display panel according to an embodiment. FIG. 4 is an equivalent circuit connected to a light-emitting diode of a display panel according to an embodiment.

Referring to FIG. 3, the display panel 10 may include an opening area OA, a display area DA, an intermediate area IA, and an outer area PA. The display panel 10 may include a plurality of pixels P in the display area DA and may display an image using light emitted from light-emitting diodes of the pixels P, for example, red, green, and blue light.

The light-emitting diode of a pixel P may be an organic light-emitting diode OLED and may be electrically connected to a pixel circuit PC. FIG. 4 shows that the light emitting diode includes the organic light-emitting diode OLED; however, in another embodiment, the display panel 10 may include an inorganic light-emitting diode.

Referring to FIG. 4, the pixel circuit PC may include first to seventh transistors T1, T2, T3, T4, T5, T6, and T7, a storage capacitor Cst, and a boost capacitor Cbt. In some embodiments, the boost capacitor Cbt may be optional.

Some of the first to seventh transistors T1, T2, T3, T4, T5, T6, and T7 may include n-channel metal oxide semiconductor field effect transistors (MOSFETs) (NMOS transistors), and the rest may include p-channel MOSFETs (PMOS transistors). The third and fourth transistors T3 and T4 may include NMOS transistors, and the rest may include PMOS transistors. In another embodiment, the third, fourth, and seventh transistors T3, T4, and T7 may include NMOS transistors, and the rest may include PMOS transistors. In some embodiments, only one of the first to seventh transistors T1, T2, T3, T4, T5, T6, and T7 may include an NMOS transistor, and the rest may include PMOS transistors.

The first to seventh transistors T1, T2, T3, T4, T5, T6, and T7, the storage capacitor Cst, and the boost capacitor Cbt may be connected to signal lines. The signal lines may include a first scan line SL1 configured to transmit a first scan signal Sn, a second scan line SL2 configured to transmit a second scan signal Sn', a previous scan line SLp configured to transmit a previous scan signal Sn−1, an emission control line 133 configured to transmit an emission control signal En, a next scan line SLn configured to transmit a next scan signal Sn+1, and a data line 171 crossing the first scan line SL1 and transmitting a data signal Dm.

A driving voltage line 175 may transfer a driving voltage ELVDD to the first transistor T1, and first and second initialization voltage lines 145 and 165 may transfer an initialization voltage Vint.

The first transistor T1 may be a driving transistor. A first gate electrode (or a first control electrode) of the first transistor T1 may be connected to the storage capacitor Cst, a first electrode of the first transistor T1 may be electrically connected to the driving voltage line 175 via the fifth transistor T5, and a second electrode of the first transistor T1 may be electrically connected to a pixel electrode of the organic light-emitting diode OLED via the sixth transistor T6. One of the first electrode and the second electrode of the first transistor T1 may be a source electrode, and the other one may be a drain electrode. The first transistor T1 may receive the data signal Dm according to a switching operation of the second transistor T2 and may supply a driving current Id to the organic light-emitting diode OLED.

The second transistor T2 may be a switching transistor. A second gate electrode (or a second control electrode) of the second transistor T2 may be connected to the first scan line SL1, a first electrode of the second transistor T2 may be connected to the data line 171, and a second electrode of the second transistor T2 may be electrically connected to the driving voltage line 175 via the fifth transistor T5 while and to the first electrode of the first transistor T1. One of the first electrode and the second electrode of the second transistor T2 may be a source electrode, and the other one may be a drain electrode. The second transistor T2 may be turned on according to the first scan signal Sn received via the first scan line SL1 and may perform a switching operation of transferring the data signal Dm received via the data line 171 to the first electrode of the first transistor T1.

The third transistor T3 may be a compensation transistor for compensating for a threshold voltage of the first transistor T1. A third gate electrode (or a compensation control electrode) of the third transistor T3 may be connected to the second scan line SL2. A first electrode of the third transistor T3 may be connected to a lower electrode CE1 of the storage capacitor Cst and the first gate electrode of the first transistor T1 through a node connection line 166. The first electrode of the third transistor T3 may be connected to the fourth transistor T4. A second electrode of the third transistor T3 may be electrically connected to the pixel electrode of the organic light-emitting diode OLED via the sixth transistor T6 and to the second electrode of the first transistor T1. One of the first electrode and the second electrode of the third transistor T3 may be a source electrode, and the other one may be a drain electrode.

The third transistor T3 may be turned on according to the second scan signal Sn' received via the second scan line SL2 and may electrically connect the first gate electrode of the first transistor T1 to the second electrode of the first transistor T1 to diode-connect the first transistor T1.

The fourth transistor T4 may be a first initialization transistor for initializing the first gate electrode of the first transistor T1. A fourth gate electrode (or a fourth control electrode) of the fourth transistor T4 may be connected to the previous scan line SLp. A first electrode of the fourth transistor T4 may be connected to the first initialization voltage line 145. A second electrode of the fourth transistor T4 may be connected to the lower electrode CE1 of the storage capacitor Cst, the first electrode of the third transistor T3, and the first gate electrode of the first transistor T1. One of the first electrode and the second electrode of the fourth transistor T4 may be a source electrode, and the other one may be a drain electrode. The fourth transistor T4 may be turned on according to the previous scan signal Sn−1 received via the previous scan line SLp and may perform an initialization operation of transferring the initialization voltage Vint to the first gate electrode of the fourth transistor T4 to initialize a voltage of the first gate electrode of the first transistor T1.

The fifth transistor T5 may be an operation control transistor. A fifth gate electrode (or a fifth control electrode) of the fifth transistor T5 may be connected to the emission control line 133, a first electrode of the fifth transistor T5 may be connected to the driving voltage line 175, and a second electrode of the fifth transistor T5 may be connected to the first electrode of the first transistor T1 and the second electrode of the second transistor T2. One of the first electrode and the second electrode of the fifth transistor T5 may be a source electrode, and the other one may be a drain electrode.

The sixth transistor T6 may be an emission control transistor. A sixth gate electrode (or a sixth control electrode) of the sixth transistor T6 may be connected to the emission control line 133, a first electrode of the sixth transistor T6 may be connected to the second electrode of the first transistor T1 and the second electrode of the third transistor T3, and a second electrode of the sixth transistor T6 may be electrically connected to a second electrode of the seventh transistor T7 and the pixel electrode of the organic light-emitting diode OLED. One of the first electrode and the second electrode of the sixth transistor T6 may be a source electrode, and the other one may be a drain electrode.

The fifth transistor T5 and the sixth transistor T6 may be simultaneously turned on according to the emission control signal En received via the emission control line 133 so as to transfer the driving voltage ELVDD to the organic light-emitting diode OLED and allow the driving current Id to flow through the organic light-emitting diode OLED.

The seventh transistor T7 may be a second initialization transistor for initializing the pixel electrode of the organic light-emitting diode OLED. A seventh gate electrode (or a seventh control electrode) of the seventh transistor T7 may be connected to the next scan line SLn. A first electrode of the seventh transistor T7 may be connected to the second initialization voltage line 165. The second electrode of the seventh transistor T7 may be connected to the second electrode of the sixth transistor T6 and the pixel electrode of the organic light-emitting diode OLED. The seventh transistor T7 may be turned on according to the next scan signal Sn+1 received via the next scan line SLn so as to initialize the pixel electrode of the organic light-emitting diode OLED. In FIG. 4, the seventh transistor T7 is connected to the next scan line SLn, but the seventh transistor T7 may be connected to the emission control line 133 and driven according to the emission control signal En.

The storage capacitor Cst may include the lower electrode CE1 and an upper electrode CE2. The lower electrode CE1 of the storage capacitor Cst may be connected to the first gate electrode of the first transistor T1, and the upper electrode CE2 of the storage capacitor Cst may be connected to the driving voltage line 175. The storage capacitor Cst may store charges corresponding to a voltage difference between a voltage of the first gate electrode of the first transistor T1 and the driving voltage ELVDD.

The boost capacitor Cbt may include a third electrode CE3 and a fourth electrode CE4. The third electrode CE3 may be connected to the second gate electrode of the second transistor T2 and the first scan line SL1, and the fourth electrode CE4 may be connected to the first electrode of the third transistor T3 and the node connection line 166. The boost capacitor Cbt may raise a voltage of a first node N1 when the first scan signal Sn transmitted to the first scan line SL1 is turned off, and when the voltage of the first node N1 rises, a black grayscale may be clearly expressed.

The first node N1 may be electrically connected to the first gate electrode of the first transistor T1, the first electrode of the third transistor T3, the second electrode of the fourth transistor T4, and the fourth electrode CE4 of the boost capacitor Cbt.

Referring to FIG. 4, the third and fourth transistors T3 and T4 may be NMOS transistors, and the first, second, and fifth to seventh transistors T1, T2, T5, T6, and T7 may be PMOS transistors. The first transistor T1 that directly affects a brightness of a display apparatus includes a semiconductor layer including polycrystalline silicon having high reliability. A high-resolution display apparatus may be implemented.

Referring to FIG. 3, the intermediate area IA may surround the opening area OA. The intermediate area IA may include no display elements (such as an organic light-emitting diodes), and signal lines for providing signals to pixels P provided around the opening area OA may cross the intermediate area IA. For example, data lines DL and/or scan lines SL extend in the display area DA in a y direction and/or an x direction. Portions of the data lines DL and/or the scan lines SL may bypass the opening area OA in the intermediate area IA along an edge of the opening 10H corresponding to the opening area OA.

A scan driver 2100 (for providing scan signals to the pixels P), a data driver 2200 (for providing data signals to the pixels P), and a first main power line (not shown) and a second main power line (not shown) for providing the first power voltage ELVDD (see FIG. 4) and the second power voltage ELVSS (see FIG. 4) may be arranged in the outer area PA. The data driver 2200 may be adjacent to one side of a substrate 100. However, according to another embodiment, the data driver 2200 may be arranged on a printed circuit board that is electrically connected to a pad arranged at one side of the display panel 10. The printed circuit board may be flexible, and a portion of the printed circuit board may be located behind a rear surface of the substrate 100.

Figure 5:
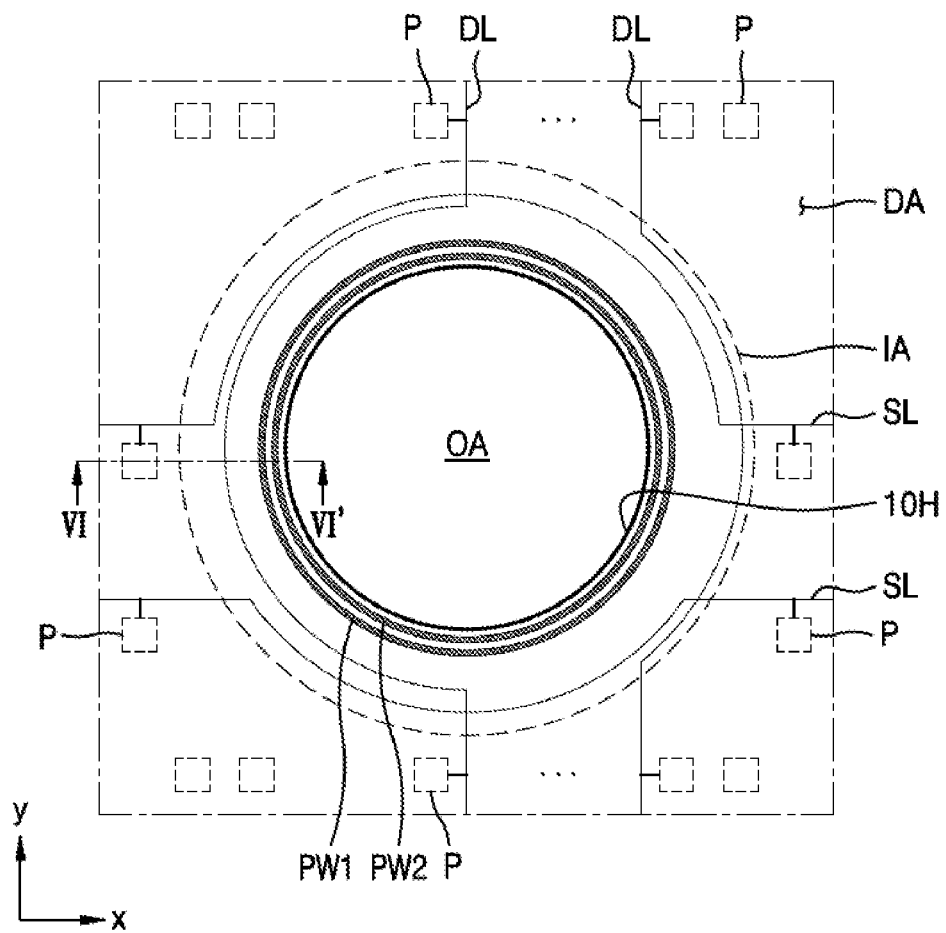
FIG. 5 is a plan view of a portion of a display panel according to an embodiment.

FIG. 5 is a plan view of a portion of a display panel according to an embodiment.

Referring to FIG. 5, pixels P may be arranged in a display area DA, and an intermediate area IA may be between an opening area OA and the display area DA. The pixels P adjacent to the opening area OA may be spaced from each other with respect to the opening area OA in a plan view. The pixels P may be vertically spaced from one another with respect to the opening area OA or may be horizontally spaced from each other with respect to the opening area OA. The pixels P may use red, green, and blue light emitted from light-emitting diodes, and positions of the pixels P shown in FIG. 5 correspond to positions of light-emitting diodes. Accordingly, when the pixels P are spaced from each other with respect to the opening area OA in a plan view, it may denote that corresponding light-emitting diodes are spaced from each other with respect to the opening area OA in a plan view. For example, in a plan view, the light-emitting diodes may be vertically spaced from each other with respect to the opening area OA or may be horizontally spaced from each other with respect to the opening area OA.

From among signal lines for supplying a signal to a pixel circuit connected to a light-emitting diode of each of the pixels P, signal lines adjacent to the opening area OA may bypass the opening area OA and/or an opening 10H. Some data lines DL may extend substantially in a ±y direction to provide data signals to the pixels P vertically spaced by the opening area OA and may bypass along the edge of the opening area OA and/or the opening 10H in the intermediate area IA. Some scan lines SL may extend substantially in a ±x direction to provide scan signals to the pixels P horizontally spaced by the opening area OA and may bypass along the edge of the opening area OA and/or the opening 10H in the intermediate area IA.

In FIG. 5, the scan line SL bypasses the opening area OA and/or the opening 10H in the intermediate area IA. In another embodiment, the scan lines SL may be separated or disconnected and may be positioned at opposite sides with respect to the opening area OA and/or the opening 10H. The scan line SL arranged on a left side of the opening area OA and/or the opening 10H may receive a signal from the scan driver 2100 arranged on a left side of the display area DA as shown in FIG. 3, and although not shown in FIG. 3, the scan line SL arranged on a right side of the opening area OA and/or the opening 10H may receive a signal from an additional scan driver arranged on an opposite side of the scan driver 2100 with respect to the display area DA.

At least one partition wall may be arranged in the intermediate area IA. The at least one partition wall may be arranged closer to the opening area OA than bypass portions of the signal lines described above. FIG. 5 shows first and second partition walls PW1 and PW2. The first and second partition walls PW1 and PW2 may each have a closed loop shape surrounding the opening area OA and/or the opening 10H and may be spaced from each other in the intermediate layer IA.

Figure 6:
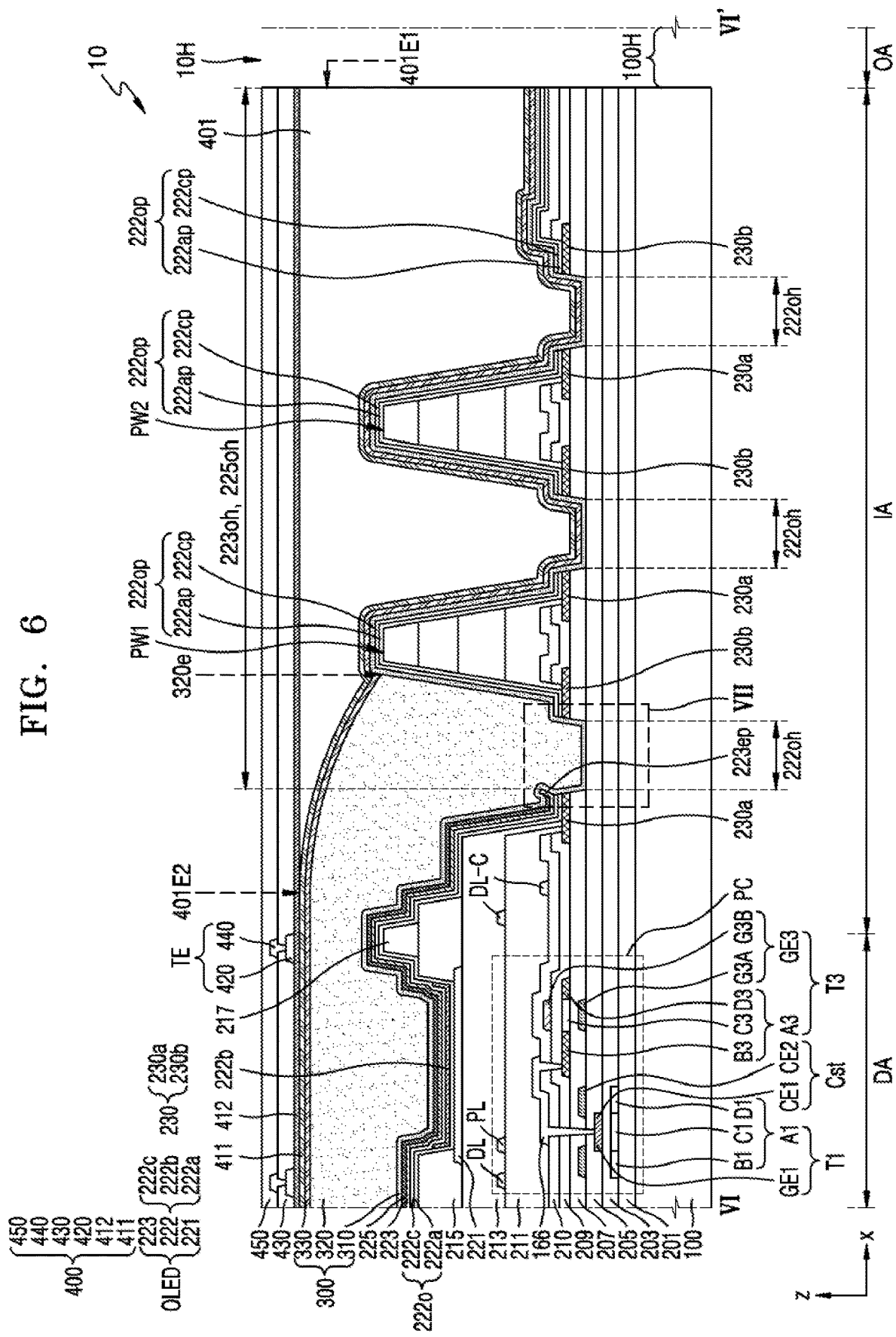
FIG. 6 is a cross-sectional view taken along line VI-VI' in FIG. 5 according to an embodiment.
Figure 7:
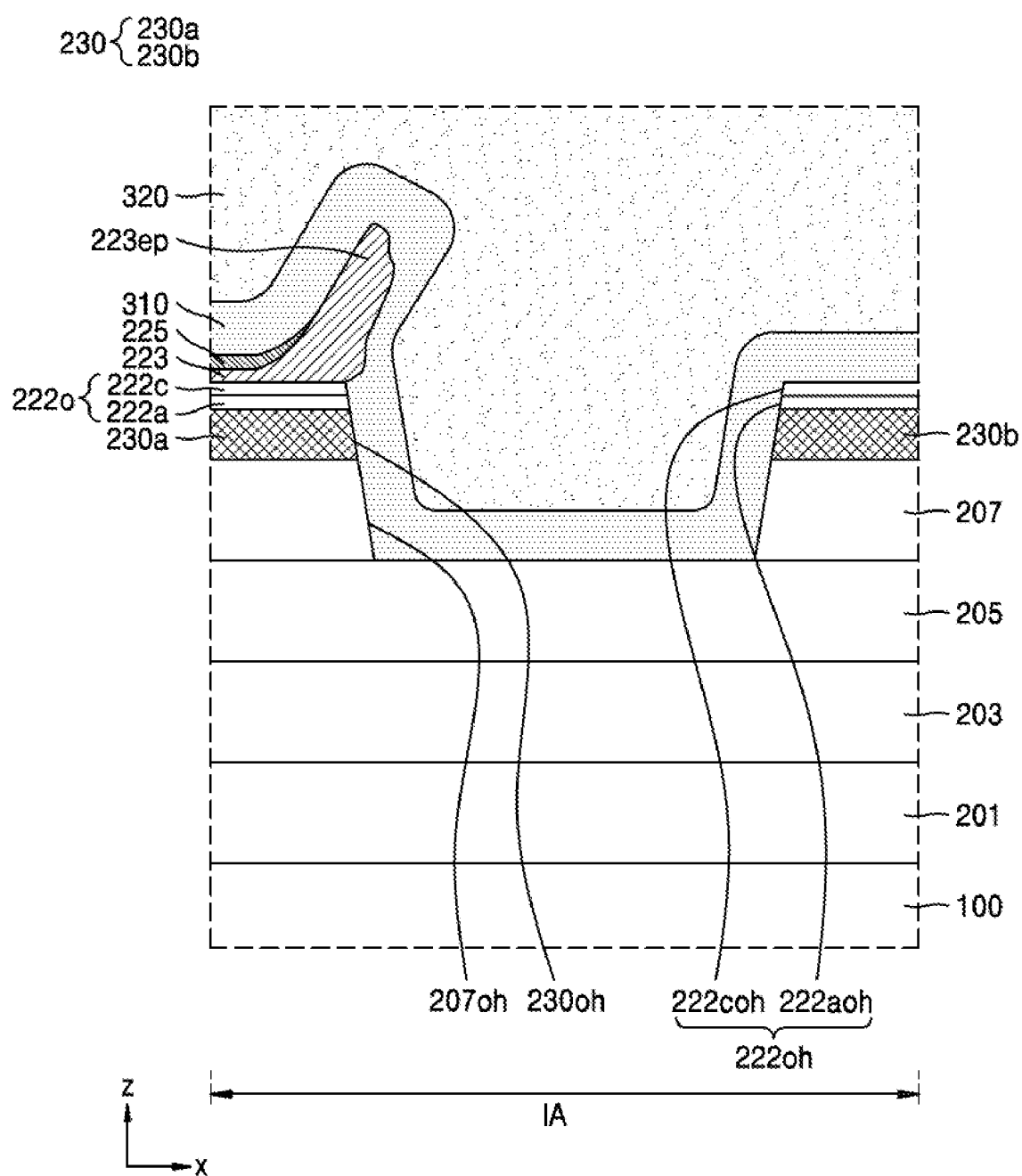
FIG. 7 schematically illustrates the VII region (or region VII) in FIG. 6 according to an embodiment.
Figure 8:
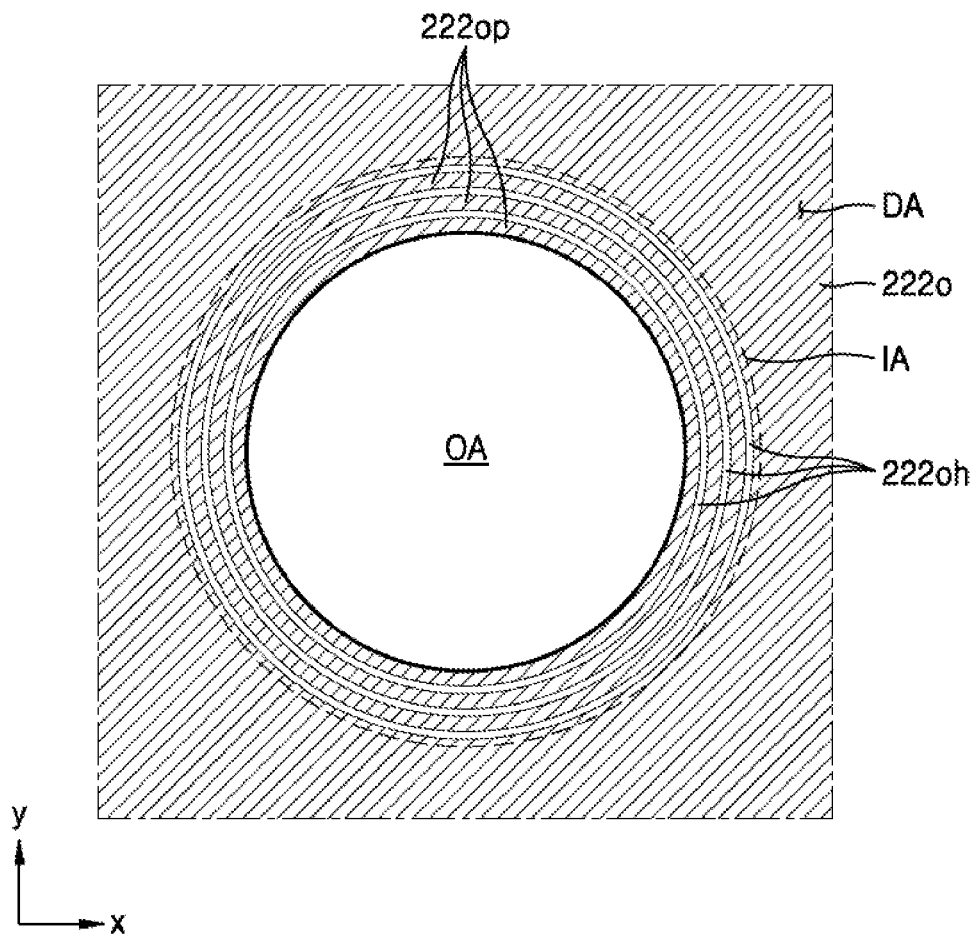
FIG. 8 is a plan view of a portion of at least one organic material layer shown in FIG. 6 according to an embodiment.
Figure 9:
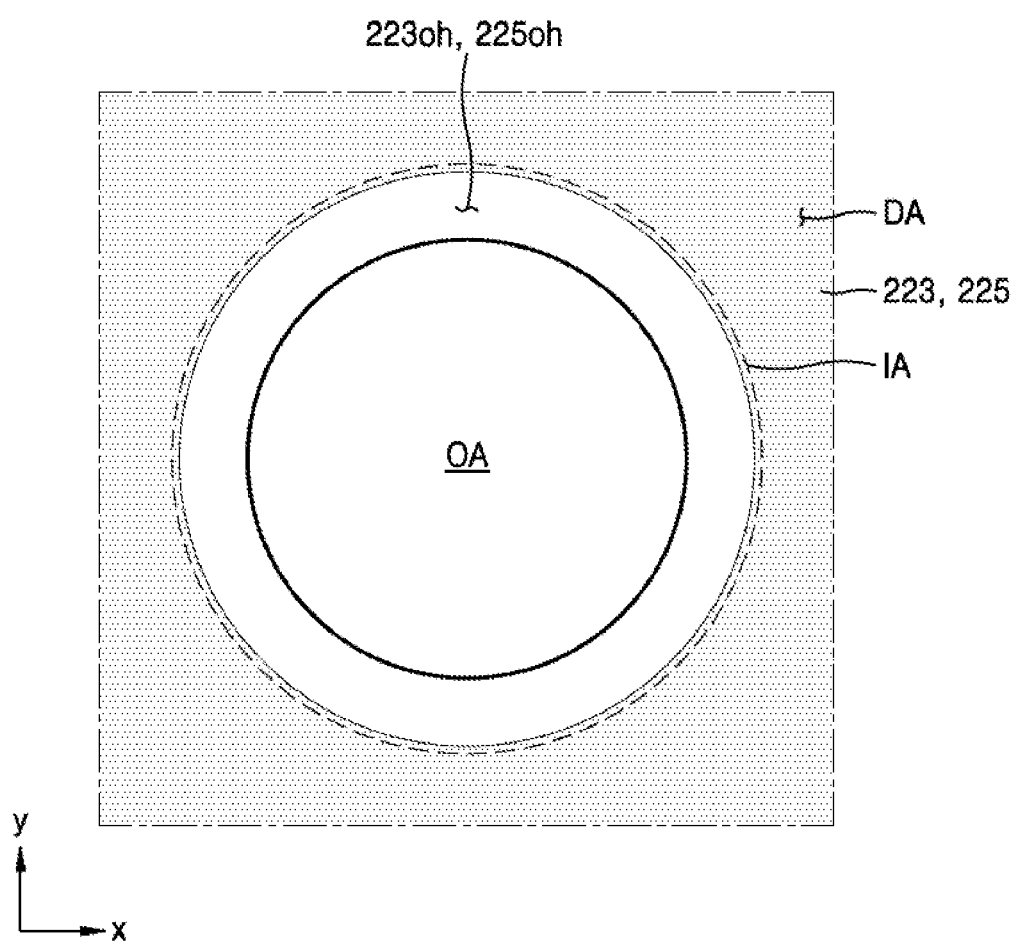
FIG. 9 is a plan view of a portion of a second electrode shown in FIG. 6 according to an embodiment.

FIG. 6 schematically illustrates a cross-sectional view taken along line VI-VI' in FIG. 5 according to an embodiment. FIG. 7 schematically illustrates a VII region in FIG. 6 according to an embodiment. FIG. 8 is a plan view of at least one organic material layer shown in FIG. 6 according to an embodiment. FIG. 9 is a plan view of a second electrode shown in FIG. 6 according to an embodiment. In FIG. 6, for convenience of explanation, the optical functional layer 50 (see FIG. 2) and the cover window 60 (see FIG. 2) of the display panel 10 are not shown, and the display element layer 20 and the input sensing layer 40 on the display element layer 20 are shown. The display element layer 20 may include light-emitting diodes on a portion of the substrate 100 that corresponds to the display area DA. FIG. 6 shows one organic light-emitting diode OLED.

Referring to FIG. 6, the display panel 10 may include the opening 10H in the opening area OA. The opening 10H may be a through hole penetrating/extending through the display panel 10.

Layers included in the display panel 10 may include openings in the opening area OA. The substrate 100 may include an opening 100H in the opening area OA. The opening 100H may be a through hole penetrating through the upper and lower surfaces of the substrate 100.

In the display area DA, at least part of a pixel circuit PC (described with reference to FIG. 4) is arranged on the substrate 100, and the organic light-emitting diode OLED may be arranged on the pixel circuit PC.

The substrate 100 may include a glass material or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including a polymer resin may be flexible, rollable, or bendable. The substrate 100 may have a multi-layer structure including a polymer layer and an inorganic layer (not shown).

A buffer layer 201 may be arranged on an upper surface of the substrate 100. The buffer layer 201 may prevent impurities from penetrating into a semiconductor layer of a transistor. The buffer layer 201 may include an inorganic insulating material such as silicon nitride, silicon oxynitride, and/or silicon oxide, and may include a single layer or layers including the inorganic insulating material described above.

The pixel circuit PC may be arranged on the buffer layer 201. The pixel circuit PC may include a plurality of transistors and a storage capacitor, as described above with reference to FIG. 4. FIG. 6 shows a first transistor T1, a third transistor T3, and a storage capacitor Cst.

The first transistor T1 may include a first semiconductor layer A1 and a first gate electrode GE1, the first semiconductor layer A1 being on the buffer layer 201, and the first gate electrode GE1 overlapping a channel area C1 of the first semiconductor layer A1. The first semiconductor layer A1 may include a silicon-based semiconductor material, for example, polysilicon. The first semiconductor layer A1 may include the channel area C1, a first area B1, and a second area D1, the first area B1 and the second area D1 being arranged at opposite sides of the channel area C1. The first area B1 and the second area D1 include a higher concentration of impurities than the channel area C1. One of the first area B1 and the second area D1 may correspond to a source area, and the other one may correspond to a drain area.

A first gate insulating layer 203 may be arranged between the first semiconductor layer A1 and the first gate electrode GE1. The first gate insulating layer 203 may include an inorganic insulating material such as silicon oxide, silicon nitride, and/or silicon oxynitride, and may include a single-layer or multi-layer structure including the inorganic insulating material described above.

The first gate electrode GE1 may include a conductive material including molybdenum (Mo), aluminum (Al), copper (Cu), and/or titanium (Ti) and may include a single-layer or multi-layer structure including the conductive material described above.

The storage capacitor Cst may include a lower electrode CE1 and an upper electrode CE2 overlapping each other. In an embodiment, the lower electrode CE1 of the storage capacitor Cst may include the first gate electrode GE1. In other words, the first gate electrode GE1 may include the lower electrode CE1 of the storage capacitor Cst. The first gate electrode GE1 and the lower electrode CE1 of the storage capacitor Cst may be integrally provided as a single body.

A first interlayer insulating layer 205 may be arranged between the lower electrode CE1 and upper electrode CE2 of the storage capacitor Cst. The first interlayer insulating layer 205 may include an inorganic insulating material such as silicon oxide, silicon nitride, and silicon oxynitride, and may include a single-layer or multi-layer structure including the inorganic insulating material described above.

The upper electrode CE2 of the storage capacitor Cst may include a low-resistance conductive material such as Mo, Al, Cu, and/or Ti, and may include a single-layer or multi-layer structure including the low-resistance conductive material described above.

A second interlayer insulating layer 207 may be arranged on the storage capacitor Cst. The second interlayer insulating layer 207 may include an inorganic insulating material such as silicon oxide, silicon nitride, and silicon oxynitride, and may include a single-layer or multi-layer structure including the inorganic insulating material described above.

A third semiconductor layer A3 of the third transistor T3 may be arranged on the second interlayer insulating layer 207. The third semiconductor layer A3 may include an oxide-based semiconductor material. The third semiconductor layer A3 may include a zinc (Zn) oxide-based material, for example, Zn oxide, indium (In)—Zn oxide, and gallium (Ga)—In—Zn oxide. In some embodiments, the third semiconductor layer A3 may include an In—Ga—Zn—O (IGZO), In—Sn—Zn—O (ITZO), or In—Ga—Sn—Zn—O (IGTZO) semiconductor, in which a metal such as In, Ga, and tin (Sn) is included in zinc oxide (ZnO).

The third semiconductor layer A3 may include a channel area C3, a first area B3, and a second area D3, the first area B3 and the second area D3 being arranged at opposite sides of the channel area C3. One of the first area B3 and the second area D3 may correspond to a source area, and the other one may correspond to a drain area.

The third transistor T3 may include a third gate electrode GE3 overlapping the channel area C3 of the third semiconductor layer A3. The third gate electrode GE3 may have a double gate structure including a lower gate electrode G3A and an upper gate electrode G3B, the lower gate electrode G3A being arranged below the third semiconductor layer A3 and the upper gate electrode G3B being arranged above the channel area C3.

The lower gate electrode G3A may be arranged on the same layer (e.g., the first interlayer insulating layer 205) as the upper electrode CE2 of the storage capacitor Cst. The lower gate electrode G3A may include the same material as the upper electrode CE2 of the storage capacitor Cst.

The upper gate electrode G3B may be arranged above the third semiconductor layer A3 with an intervening second gate insulating layer 209. The second gate insulating layer 209 may include an inorganic insulating material such as silicon oxide, silicon nitride, and silicon oxynitride, and may include a single-layer or multi-layer structure including the inorganic insulating material described above.

A third interlayer insulating layer 210 may be arranged on the upper gate electrode G3B. The third interlayer insulating layer 210 may include an inorganic insulating material such as silicon oxynitride and may include a single-layer or multi-layer structure including the inorganic insulating material described above.

In FIG. 6, the upper electrode CE2 of the storage capacitor Cst is arranged on the same layer as the lower gate electrode G3A of the third gate electrode GE3. In another embodiment, the upper electrode CE2 of the storage capacitor Cst may be arranged on the same layer as the third semiconductor layer A3 and may include the same material as the first area B3 and second area D3 of the third semiconductor layer A3.

The first transistor T1 and the third transistor T3 may be electrically connected to each other through a node connection line 166. The node connection line 166 may be arranged on the third interlayer insulating layer 210. One side of the node connection line 166 may be connected to the first gate electrode GE1 of the first transistor T1, and the other side of the node connection line 166 may be connected to the third semiconductor layer A3 of the third transistor T3.

The node connection line 166 may include Al, Cu, and/or Ti and may include a single layer or layers. The node connection line 166 may have a three-layer structure of a Ti layer, an Al layer, and another Ti layer.

A first organic insulating layer 211 may be arranged on the node connection line 166. The first organic insulating layer 211 may include an organic insulating material. The organic insulating material may include acryl, benzocyclobutene (BCB), polyimide, or hexamethyldisiloxane (HMDSO).

The data line DL and the driving voltage line PL may be arranged on the first organic insulating layer 211, and may be covered with a second organic insulating layer 213. The data line DL and the driving voltage line PL may include Al, Cu, and/or Ti and may include a single layer or layers. The data line DL and the driving voltage line PL may each have a three-layer structure of a Ti layer, an Al layer, and another Ti layer.

The second organic insulating layer 213 may include an organic insulating material such as acryl, BCB, polyimide, and/or HMDSO. In FIG. 6, the data line DL and the driving voltage line PL are provided on the first organic insulating layer 211. In another embodiment, one of the data line DL and the driving voltage line PL may be arranged on the same layer as the node connection line 166, for example, on the third interlayer insulating layer 210.

A first electrode 221 (or pixel electrode 221) of the organic light-emitting diode OLED may include a reflective layer including silver (Ag), magnesium (Mg), Al, platinum (Pt), palladium (Pd), gold (Au), nickel (Ni), neodymium (Nd), iridium (Ir), chrome (Cr), or any compounds thereof. In another embodiment, the first electrode 221 may further include a conductive oxide layer above and/or below the reflective layer. The conductive oxide layer may include indium tin oxide (ITO), indium zinc oxide (IZO), ZnO, indium oxide ($In_2O_3$), indium gallium oxide (IGO), and/or aluminum zinc oxide (AZO). In an embodiment, the first electrode 221 may have a three-layer structure of an ITO layer, an Ag layer, and another ITO layer.

A bank layer 215 may be arranged on the first electrode 221. The bank layer 215 may include an opening overlapping the first electrode 221 and may cover an edge of the first electrode 221. The bank layer 215 may include an organic insulating material such as polyimide.

A spacer 217 may be provided on the bank layer 215. The spacer 217 may be provided together with the bank layer 215 in the same process, or may be individually provided in separate processes. In an embodiment, the spacer 217 may include an organic insulating material such as polyimide. In some embodiments, the bank layer 215 may include an organic insulating material including a light-blocking dye, and the spacer 217 may include an organic insulating material such as polyimide.

An intermediate layer 222 may include an emission layer 222b. The intermediate layer 222 may include a first functional layer 222a and/or a second functional layer 222c, the first functional layer 222a being arranged below the emission layer 222b, and the second functional layer 222c being arranged above the emission layer 222b. The emission layer 222b may include a polymer or low-molecular weight organic material emitting light of a color. The second functional layer 222c may include an electron transport layer (ETL) and/or an electron injection layer (EIL). The first functional layer 222a and the second functional layer 222c may each include an organic material.

A second electrode 223 (or common/overlapping electrode 223) may include a conductive material having a low work function. For example, the second electrode 223 may include a (semi-)transparent layer including Ag, Mg, Al, Pt, Pd, Au, Ni, Nd, Ir, Cr, Li, Ca, or any alloys thereof. In some embodiments, the second electrode 223 may further include a (transparent) layer on the (semi-)transparent layer, the (transparent) layer including ITO, IZO, ZnO, or $In_2O_3$.

The emission layer 222b may overlap a portion of the first electrode 221 exposed through an opening of the bank layer 215. The first functional layer 222a and the second functional layer 222c may entirely cover the display area DA. The second electrode 223 may entirely cover the display area DA.

A capping layer 225 may be arranged on the second electrode 223. The capping layer 225 may include an inorganic material or an organic material. The capping layer 225 may include lithium fluoride (LiF), an inorganic insulating material, and/or an organic insulating material. The capping layer 225 may entirely cover the display area DA.

The organic light-emitting diode OLED may be covered with an encapsulation layer 300, the organic light-emitting diode OLED including the first electrode 221, the intermediate layer 222, and the second electrode 223. The encapsulation layer 300 may include at least one organic encapsulation layer and at least one inorganic encapsulation layer. In an embodiment, FIG. 6 shows that the encapsulation layer 300 includes first and second inorganic encapsulation layers 310 and 330 and includes an organic encapsulation layer 320 between the layers 310 and 330. The encapsulation layer 300 may be arranged on the capping layer 225.

The first inorganic encapsulation layer 310 and the second inorganic encapsulation layer 330 may each include one or more inorganic materials from among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may each include a single layer or layers including the materials described above. The organic encapsulation layer 320 may include a polymer-based material. The polymer-based material may include an acryl-based resin, an epoxy-based resin, polyimide, polyethylene, and the like. In an embodiment, the organic encapsulation layer 320 may include acrylate.

The first inorganic encapsulation layer 310 and the second inorganic encapsulation layer 330 may have different thicknesses. A thickness of the first inorganic encapsulation layer 310 may be greater than a thickness of the second inorganic encapsulation layer 330. In some embodiments, the thickness of the second inorganic encapsulation layer 330 may be greater than the thickness of the first inorganic encapsulation layer 310, or the first inorganic encapsulation layer 310 and the second inorganic encapsulation layer 330 may have the same thickness.

An input sensing layer 400 may be arranged on the encapsulation layer 300. The input sensing layer 400 may include touch electrodes TE and at least one touch insulating layer, the touch electrodes TE being arranged in the display area DA. FIG. 6 shows that the input sensing layer 400 includes a first touch insulating layer 411, a second touch insulating layer 412, a first conductive line 420, a third touch insulating layer 430, a second conductive line 440, and a fourth touch insulating layer 450, the first touch insulating layer 411 being on the second inorganic encapsulation layer 330, the third touch insulating layer 430 being on the first conductive line 420, the second conductive line 440 being on the third touch insulating layer 430, and the fourth touch insulating layer 450 being on the second conductive line 440.

Each of the first touch insulating layer 411, the second touch insulating layer 412, the third touch insulating layer 430, and the fourth touch insulating layer 450 may include an inorganic insulating material and/or an organic insulating material. In an embodiment, the first touch insulating layer 411, the second touch insulating layer 412, and the third touch insulating layer 430 may each include an inorganic insulating material such as silicon oxide, silicon nitride, and/or silicon oxynitride, and the fourth touch insulating layer 450 may include an organic insulating material.

The touch electrode TE of the input sensing layer 400 may include a structure in which the first conductive line 420 and the second conductive line 440 are connected to each other. In some embodiments, the touch electrode TE may have either one of the first conductive line 420 and the second conductive line 440, and the third touch insulating layer 430 may be optional.

Each of the first conductive line 420 and the second conductive line 440 may include Al, Cu, and/or Ti and may include a single layer or layers including the materials described above. For example, the first conductive line 420 and the second conductive line 440 may each include a three-layer structure of a Ti layer, an Al layer, and another Ti layer.

Next, referring to the intermediate area IA in FIG. 6, the first organic insulating layer 211 and the second organic insulating layer 213 may each extend to the intermediate area IA. Each of the first organic insulating layer 211 and the second organic insulating layer 213 may be spaced from a first partition wall PW1.

In the intermediate area IA, bypass portions DL-C of data lines may be arranged on different layers and may be separated by the first organic insulating layer 211. One of the bypass portions DL-C of neighboring data lines may be arranged on the first organic insulating layer 211, and the other one may be arranged below the first organic insulating layer 211. The bypass portions DL-C of the data lines shown in FIG. 6 may be a curved portion of the data line DL arranged in the intermediate area IA and along the opening area OA described above with reference to FIG. 5.

At least one partition wall may be arranged in the intermediate area IA. In an embodiment, FIG. 6 shows two partition walls are arranged in the intermediate area IA, but in another embodiment, three or more partition walls may be present in the intermediate area IA.

The first partition wall PW1 and the second partition wall PW2 may be arranged in the intermediate area IA, and may be spaced from each other in a direction from the display area DA toward the opening area OA. The first partition wall PW1 may be closest/closer to the display area DA, and the second partition wall PW2 may be arranged closer to the opening area OA than the first partition wall PW1. Each of the first partition wall PW1 and the second partition wall PW2 may have a closed-loop shape surrounding the opening 10H, as shown in FIG. 5.

The opening 100H in the substrate 100 corresponds to the opening 10H of the display panel 10; thus, the "opening area OA," the "opening 10H of the display panel 10," and "the opening 100H of the substrate 100" may be interchangeably used in the present disclosure. For example, "surrounding the opening 10H of the display panel 10" may be equivalent to surrounding the opening 100H of the substrate 100 and/or surrounding the opening area OA.

The first partition PW1 and the second partition PW2 may each include an insulating material. The first partition wall PW1 and the second partition wall PW2 may each include an organic insulating material and may be provided in a process of forming a plurality of insulating material layers.

The first partition wall PW1 and the second partition wall PW2 may have the same height or different heights. In FIG. 6, the first partition wall PW1 and the second partition wall PW2 have the same height, but in another embodiment, the first partition wall PW1 and the second partition wall PW2 may have different heights from each other.

The first partition wall PW1 and the second partition wall PW2 may control a flow of materials included in the organic encapsulation layer 320 in a process of forming the encapsulation layer 300. The organic encapsulation layer 320 may be provided by coating a monomer on the display area DA through an inkjet process, etc., and then curing the monomer. The one or more partition walls may control a flow of the monomer to control a position of the organic encapsulation layer 320. FIG. 6 shows that an edge 320e of the organic encapsulation layer 320 is on one side of the first partition wall PW1. In another embodiment, the edge 320e of the organic encapsulation layer 320 may be arranged on an upper surface of the first partition wall PW1 so that a portion of the organic encapsulation layer 320 may overlap the upper surface of the first partition wall PW1.

Because the edge 320e of the organic encapsulation layer 320 is on one side of one of the partition walls, for example, the first partition wall PW1, the second inorganic encapsulation layer 330 may be in direct contact with the first partition wall PW1 in the intermediate area IA. The first and second inorganic encapsulation layers 310 and 330 may directly contact each other in an area between the edge 320e of the organic encapsulation layer 320 and the opening 10H of the display panel 10. In an embodiment, FIG. 6 shows that the first inorganic encapsulation layer 310 and the second inorganic encapsulation layer 330 are in direct contact with each other in an area between the first partition wall PW1 and the opening 10H of the display panel 10.

Insulating layers of the input sensing layer 400, for example, the first touch insulating layer 411, the second touch insulating layer 412, the third touch insulating layer 430, and the fourth touch insulating layer 450, may each extend to cover the intermediate area IA.

A planarization insulating layer (or a planarization layer) 401 may cover the intermediate area IA. The planarization insulating layer 401 may be arranged only in the intermediate area IA and may have a width from a first edge 401E1 to a second edge 401E2. In a plan view, the planarization insulating layer 401 may have a closed-loop shape (e.g., a donut shape) surrounding the opening 10H.

The first edge 401E1 of the planarization insulating layer 401 may be part of an edge of the opening 10H of the display panel 10. The second edge 401E2 of the planarization insulating layer 401 may be adjacent to the display area DA. A portion of the planarization insulating layer 401 adjacent to the display area DA may overlap a portion of the organic encapsulation layer 320 and may cover the edge 320e of the organic encapsulation layer 320. The second inorganic encapsulation layer 330 and the first touch insulating layer 411 may be arranged between the organic encapsulation layer 320 and the first touch insulating layer 411 in a thickness direction (a z direction) of the display panel 10.

The first touch insulating layer 411 and the second touch insulating layer 412 may directly contact each other in the display area DA and may be separated from each other in the thickness direction (the z direction) by the planarization insulating layer 401 in the intermediate area IA.

At least one organic material layer 222o included in the intermediate layer 222 may be provided to entirely cover the display area DA, and thus may provide a progressing path for moisture that may be introduced through the opening 10H of the display panel 10. However, according to an embodiment, the organic material layer 222o includes an opening portion (hereinafter, referred to as a first opening portion 222oh) in the intermediate area IA, and thus, progressing of moisture through the organic material layer 222o may be prevented or minimized.

The organic material layer 222o may include separation portions 222op (or separated portions 222op) spaced from each other in the intermediate area IA by the first opening portion 222oh. Since the organic material layer 222o includes the first functional layer 222a and the second functional layer 222c, the separation portion 222op of the organic material layer 222o may include a portion of the first functional layer 222a and a portion of the second functional layer 222c overlapping each other.

Referring to FIG. 7, since the organic material layer 222o includes the first functional layer 222a and the second functional layer 222c, an opening portion 222aoh of the first functional layer 222a and an opening portion 222coh of the second functional layer 222c may constitute the first opening portion 222oh described above.

The first opening portion 222oh of the organic material layer 222o is provided through a laser lift-off process using a sacrificial layer, and in this case, the sacrificial layer may include any one selected from among a gate electrode of a transistor included in the pixel circuit PC and electrodes of the storage capacitor Cst. In a manufacturing process, the sacrificial layer described above may be covered with at least one insulating layer, and an opening provided in the at least one insulating layer may be arranged below the first opening portion 222oh of the organic material layer 222o. FIG. 7 shows an opening portion 207oh provided in the second interlayer insulating layer 207.

A stopper layer 230 may be arranged between the organic material layer 222o and at least one insulating layer (for example, the second interlayer insulating layer 207) in the intermediate area IA. The stopper layer 230 may prevent a portion of insulating layers (insulating layers below the stopper layer 230) and/or the substrate 100 from being unintentionally etched in another etching process performed before the above-described lift-off process.

The stopper layer 230 may include an opening portion 230oh corresponding to the first opening portion 222oh of the organic material layer 222o. The stopper layer 230 may include a first portion 230a and a second portion 230b at opposite sides of the opening portion 230oh. Portions of the organic material layer 222o arranged at opposite sides of the first opening portion 222oh may be arranged directly above the first portion 230a and the second portion 230b of the stopper layer 230, respectively.

Through the first opening portion 222oh of the organic material layer 222o, the opening portion 230oh of the stopper layer 230, and the opening portion 207oh of the second interlayer insulating layer 207, the first interlayer insulating layer 205 may be exposed, and the first inorganic encapsulation layer 310 may directly contact the first interlayer insulating layer 205. The first interlayer insulating layer 205 may include an inorganic insulating material, and a contact between the first inorganic encapsulation layer 310 and the first interlayer insulating layer 205 may locally prevent the progress of moisture.

The first opening portions 222oh of the organic material layer 222o may be spaced from each other in the intermediate area IA. FIG. 6 shows the first opening portion 222oh between the first partition wall PW1 and the display area DA, the first opening portion 222oh between the first partition wall PW1 and the second partition wall PW2, and the first opening portion 222oh between the second partition wall PW2 and the opening 10H. Structures below the first opening portion 222oh described with reference to FIG. 7 may be spaced from each other in the intermediate area IA.

Each of the first opening portions 222oh may extend along an edge of the opening 10H and have a closed-loop shape completely surrounding the opening 10H in a plan view, as shown in FIG. 8. Accordingly, the separation portions 222op of the organic material layer 222o may be spaced from each other by the first opening portions 222oh and may each have a closed-loop shape entirely surrounding the opening area OA. In a cross-sectional view, the separation portions 222op of the organic material layer 222o may cover the first partition wall PW1, the second partition wall PW2, and/or an area between the second partition wall PW2 and the opening 10H, as shown in FIG. 6. The separation portions 222op of the organic material layer 222o located on the first partition wall PW1, located on the second partition wall PW2, and/or located between the second partition wall PW2 and the opening 10H may be directly contacted and covered by the first inorganic encapsulation layer 310.

The second electrode 223 may entirely cover the display area DA and may extend to the intermediate area IA. An edge portion 223ep of the second electrode 223 may be arranged between the display area DA and at least one partition wall. In an embodiment, FIG. 6 shows that the edge portion 223ep of the second electrode 223 is arranged between the display area DA and the first partition wall PW1.

In an embodiment, the edge portion 223ep of the second electrode 223 shown in FIG. 6 may be a portion of the second electrode 223 closest to the opening 10H, and no portion of the second electrode 223 may be in an area from the edge portion 223ep of the second electrode 223 to the opening 10H. In other words, there may not be a layer having the same material and the same structure as the second electrode 223 between the edge portion 223ep of the second electrode 223 and the opening 10H.

Like the second electrode 223, the capping layer 225 may extend to the intermediate area IA, and one edge of the capping layer 225 may be arranged between the display area DA and at least one partition wall. No portion of the capping layer 225 may be in an area from the one edge of the capping layer 225 to the opening 10H.

Regarding the above, FIGS. 6 and 9 show a second opening portion 223oh arranged in the intermediate area IA and surrounded by the edge portion 223ep of the second electrode 223, and show a third opening portion 225oh) arranged in an intermediate layer 222 and surrounded by one edge of the capping layer 225. The second electrode 223 may include one second opening portion 223oh having a closed-loop shape surrounding the opening area OA in a plan view of the display panel, and the capping layer 225 may include one third opening portion 225oh having a closed-loop shape surrounding the opening area OA in the plan view of the display panel. The second opening portion 223oh and the third opening portion 225oh may have sizes (or widths) such that the first partition wall PW1 and the second partition wall PW2 are arranged in the opening portion 223oh of the second electrode 223 and the opening portion 225oh of the capping layer 225, respectively.

The edge portion 223ep of the second electrode 223 may be overlapped and covered by the organic encapsulation layer 320. The second electrode 223 may be provided by forming a second electrode material layer entirely covering the display area DA and the intermediate layer IA, and then removing a portion of a second electrode material layer arranged in the intermediate area IA. The portion of the second electrode material layer may be removed through a laser lift-off process, and the edge portion 223ep of the second electrode 223 may have an irregular shape caused by a laser. For example, as shown in FIG. 7, the edge portion 223ep of the second electrode 223 may have a burr formed by the laser lift-off process. The edge portion 223ep of the second electrode 223 may extend in an oblique direction away from an upper surface of the substrate 100 and may have an irregular cross-section.

The first inorganic encapsulation layer 310 on the second electrode 223 may not have a constant thickness due to the shape of the edge portion 223ep of the second electrode 223. For example, as shown in FIG. 7, the first inorganic encapsulation layer 310 may include an upper surface that is convex upward along the shape of the edge portion 223ep of the second electrode 223.

Although the first inorganic encapsulation layer 310 has relatively excellent step coverage, because the edge portion 223ep of the second electrode 223 under the first inorganic encapsulation layer 310 has an irregular shape, the first inorganic encapsulation layer 310 may include a portion having a small local density and/or a thin portion. In this case, cracks may occur in the first inorganic encapsulation layer 310, and the cracks may be significantly transferred to the surroundings. However, according to an embodiment, because the organic encapsulation layer 320 overlaps and/or covers the edge portion 223ep of the second electrode 223, the crack issue may be prevented or reduced.

Referring to FIGS. 6, 8, and 9, while the organic material layer 222o may include a plurality of first opening portions 222oh, the second electrode 223 and/or the capping layer 225 may include one second opening portion 223oh and/or one third opening portion 225oh. The one second opening portion 223oh and/or the one third opening portion 225oh may overlap the plurality of second opening portions 222oh. In other words, the second opening portions 222oh and the separation portions 222op may be arranged in the one second opening portion 223oh and/or the one third opening portion 225oh.

FIGS. 10A to 10D are cross-sectional views illustrating structures formed in a manufacturing process of a display panel according to an embodiment.

Figure 10A:
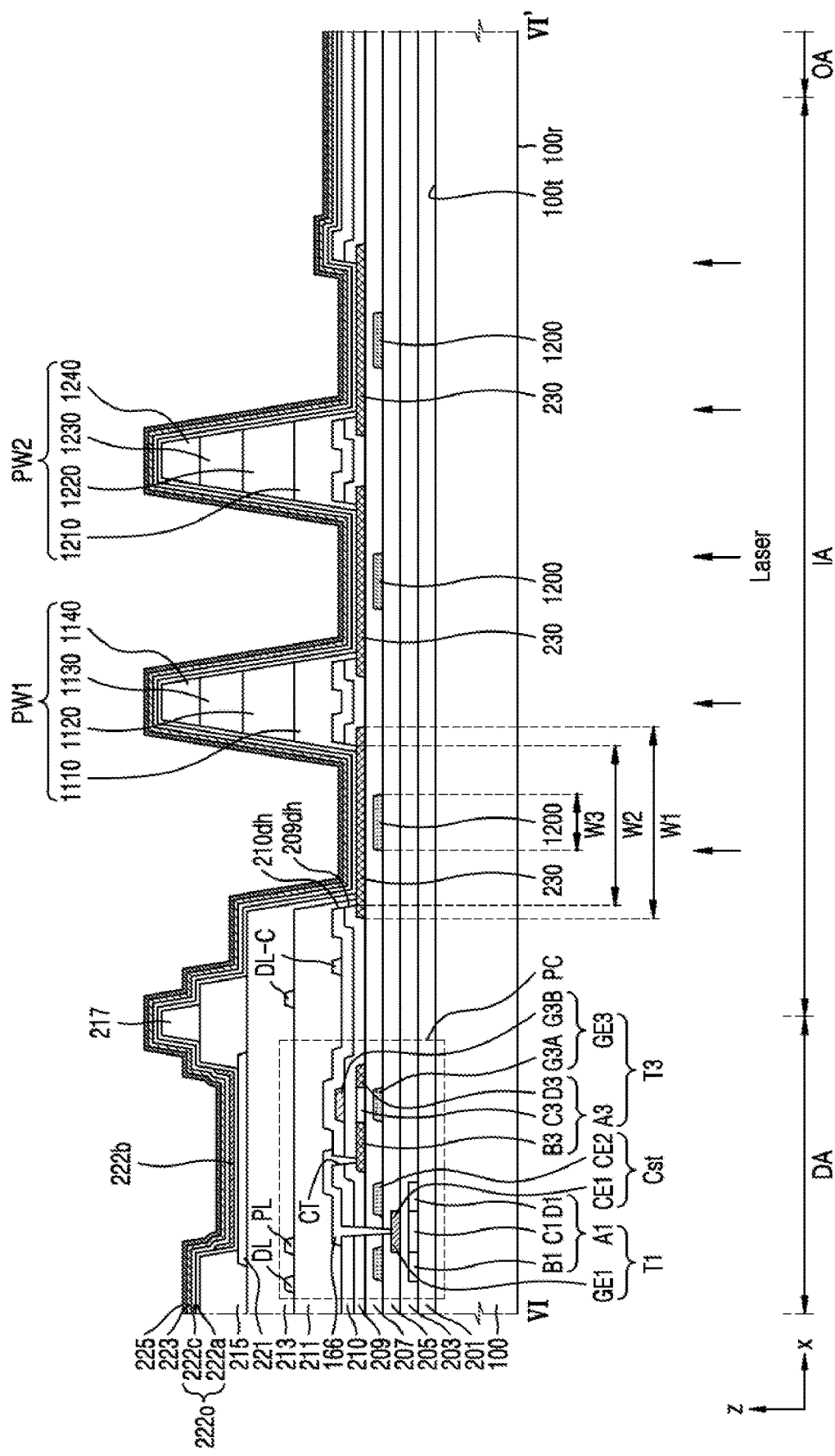
FIG. 10A, FIG. 10B, FIG. 10C, and FIG. 10D are cross-sectional views of structures formed in a manufacturing process of a display panel according to an embodiment.

Referring to FIG. 10A, a pixel circuit PC may be provided on a substrate 100 in a display area DA, the pixel circuit PC including a transistor and a storage capacitor Cst. FIG. 10A shows that the pixel circuit PC includes first and third transistors T1 and T3 and the storage capacitor Cst as described above with reference to FIG. 6. A buffer layer 201 may be provided before the pixel circuit PC is provided.

A process of forming the pixel circuit PC may include a process of forming electrodes of the transistors and the storage capacitor Cst and a process of forming insulating layers. A first gate insulating layer 203 and a first interlayer insulating layer 205 may entirely cover the display area DA, an intermediate area IA, and an opening area OA.

Sacrificial layers 1200 may be provided in the intermediate area IA. The sacrificial layers 1200 may be spaced from each other in the intermediate area IA may be provided in the same process as one of the electrodes of the storage capacitor Cst, for example, an upper electrode CE2. Regarding the above, FIG. 10A shows that the sacrificial layers 1200 are located directly on the same first interlayer insulating layer 205 as the upper electrode CE2 of the storage capacitor Cst. The sacrificial layer 1200 may include the same material as the upper electrode CE2 of the storage capacitor Cst.

At least one insulating layer may be provided on the sacrificial layer 1200, and regarding this, FIG. 10A shows that a second interlayer insulating layer 207 covers the sacrificial layers 1200.

Subsequently, a stopper layer 230 may be provided on the second interlayer insulating layer 207. The stopper layer 230 may be provided in the same process as a third semiconductor layer A3. The stopper layer 230 may be arranged directly on the same second interlayer insulating layer 207 as the third semiconductor layer A3 and may include the same material as (the first and second areas B3 and C3 of) the third semiconductor layer A3.

At least one insulating layer, for example, an inorganic insulating layer, such as the second gate insulating layer 209 and the third interlayer insulating layer 210, may be provided on the stopper layer 230. The second gate insulating layer 209 and the third interlayer insulating layer 210 may include dummy holes 209dh and 210dh, respectively, the dummy holes 209dh and 210dh exposing the stopper layer 230. The dummy holes 209dh and 210dh may be provided in a process of forming a contact hole CT to connect a node connection line 166 and the third semiconductor layer A3 to each other. The stopper layer 230 may prevent layers below the stopper layer 230 (for example, insulating layers) from being damaged in an etching process for forming the dummy holes 209dh and 210dh and the contact hole CT and/or an etching process for forming the first electrode 221 to be described later.

In a comparative example, when the stopper layer 230 is not provided, in the above-described etching process/processes, layers above and/or below the sacrificial layer 1200 (for example, a portion of the second interlayer insulating layer 207, the first interlayer insulating layer 205, the first gate insulating layer 203, the buffer layer 201, and the substrate 100) may be unintentionally etched around edges of the sacrificial layer 1200. However, according to an embodiment, the stopper layer 230 may function as an etch stopper in the etching process for forming the dummy holes 209dh and 210dh and the contact hole CT described above and in the etching process for forming a first electrode 221 to be described later, and thus, the above-described problem may be prevented.

A width W1 of the stopper layer 230 may be greater than a width W2 of each of the dummy holes 209dh and 210dh. Thus, edges of the stopper layer 230 may be covered by the second gate insulating layer 209 and the third interlayer insulating layer 210. The stopper layer 230 may entirely cover the sacrificial layer 1200, and the width W1 of the stopper layer 230 may be greater than a width W3 of the sacrificial layer 1200.

Subsequently, a first organic insulating layer 211 and a second organic insulating layer 213 may be provided. The first organic insulating layer 211 and the second organic insulating layer 213 may be arranged in the display area DA, but may partially extend to the intermediate area IA. An end portion of each of the first organic insulating layer 211 and the second organic insulating layer 213 may be arranged in the intermediate area IA, but may be spaced from the first partition wall PW1.

Before the second organic insulating layer 213 is provided, bypass portions DL-C of data lines may be provided below and above the first organic insulating layer 211, respectively.

In the display area DA, the first electrode 221 may be provided on the second organic insulating layer 213, and a bank layer 215 and a spacer 217 may be provided on the first electrode 221. The first electrode 221 may be provided by forming an electrode material layer and then etching (for example, wet-etching) the electrode material layer.

First and second partition walls PW1 and PW2 may be provided in the intermediate area IA. The first and second partition walls PW1 and PW2 may be provided in a process of forming the first and second organic insulating layers 211 and 213, the bank layer 215, and the spacer 217.

The first partition wall PW1 may include a stacked structure of a first sub-partition wall layer 1110, a second sub-partition wall layer 1120, a third sub-partition wall layer 1130, and a fourth sub-partition wall layer 1140. The second partition wall PW2 may include a first sub-partition wall layer 1210, a second sub-partition wall layer 1220, a third sub-partition wall layer 1230, and a fourth sub-partition wall layer 1240. The first sub-partition wall layers 1110 and 1210 of the first and second partition walls PW1 and PW2 may be provided in the same process as the first organic insulating layer 211 and may include the same material. The second sub-partition wall layers 1120 and 1220 may be provided in the same process as the second organic insulating layer 213 and may include the same material. The third sub-partition wall layers 1130 and 1230 may be provided in the same process as the bank layer 215 and may include the same material. The fourth sub-partition wall layers 1140 and 1240 may be provided in the same process as the spacer 217 and may include the same material. Opposite sides of each of the first and second partition walls PW1 and PW2 may be arranged on stopper layers 230 that are spaced from each other.

The bank layer 215 may cover the edge of the first electrode 221. An emission layer 222b may be provided in an opening of the bank layer 215 exposing a portion of the first electrode 221. A first functional layer 222a may be provided below the emission layer 222b, and/or a second functional layer 222c may be provided above the emission layer 222b. Subsequently, a second electrode 223 and a capping layer 225 may be provided.

The first functional layer 222a, the second functional layer 222c, the second electrode 223, and the capping layer 225 may substantially cover the substrate 100. Regarding the above, FIG. 10A shows that the first functional layer 222a, the second functional layer 222c, the second electrode 223, and the capping layer 225 are arranged on the stopper layer 230 through the dummy holes 209dh and 210dh. The first functional layer 222a, the second functional layer 222c, the second electrode 223, and the capping layer 225 may also be arranged on the first and second partition walls PW1 and PW2.

If the first functional layer 222a, the second functional layer 222c, and the second electrode 223 entirely cover the upper surface of the substrate 100 and include no openings, cracks may occur in the layers, and/or moisture may enter light-emitting diodes through the layers. To form openings in the layers, portions of the first and second functional layers 222a and 222c and portions of the second electrode 223 may be removed (in the intermediate area IA) by a laser beam irradiated to the substrate 100.

The laser beam may be irradiated in the +z direction and may cross a lower surface 100r of the substrate 100 and subsequently cross an upper surface 100t of the substrate 100. The laser beam may be irradiated multiple times. A type, output, size, and/or irradiation range of the laser beam may be changed. In some embodiments, an output of the laser may be set based on a band gap of the second electrode 223.

Figure 10B:
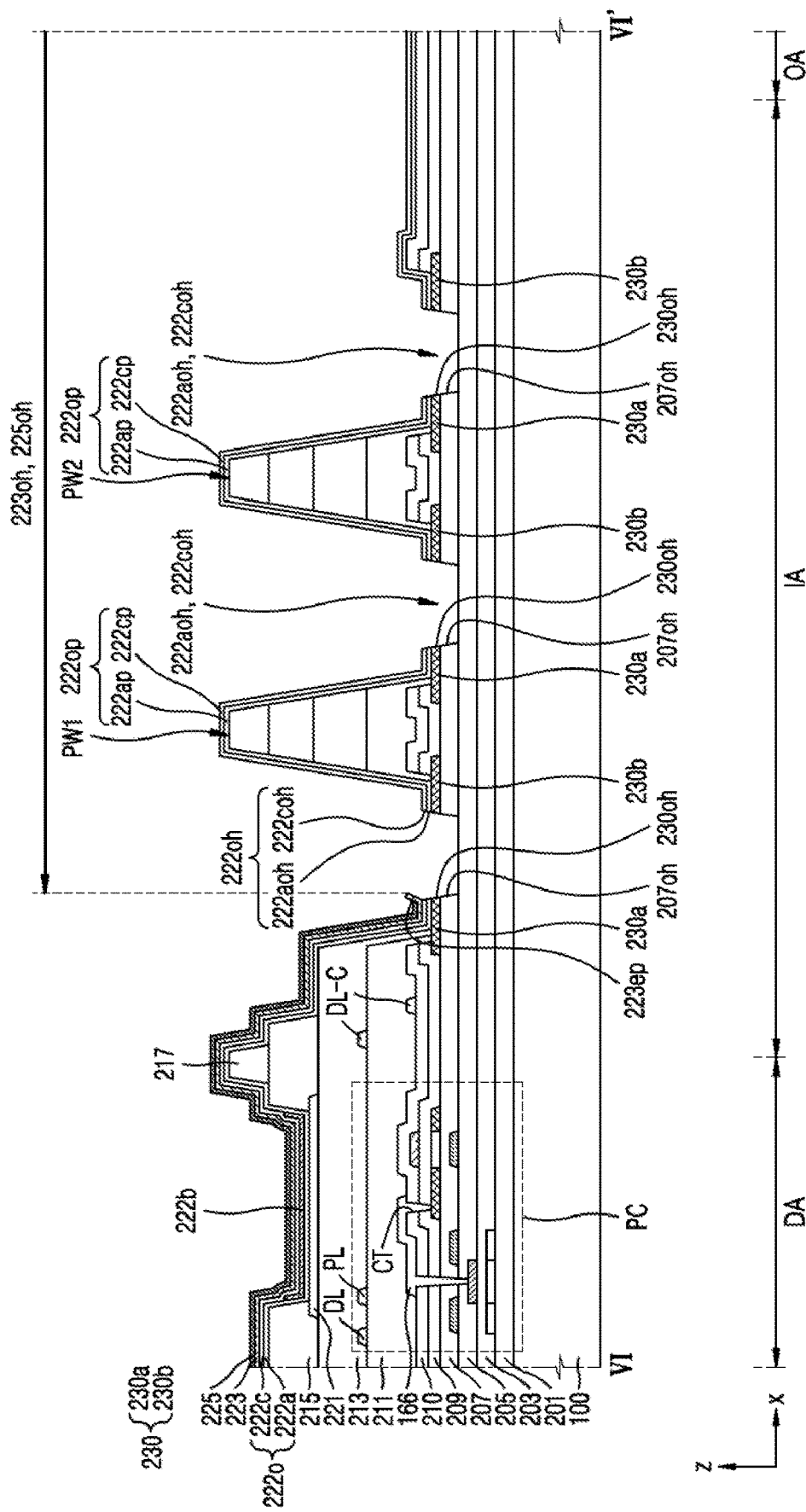
Figure 10C:
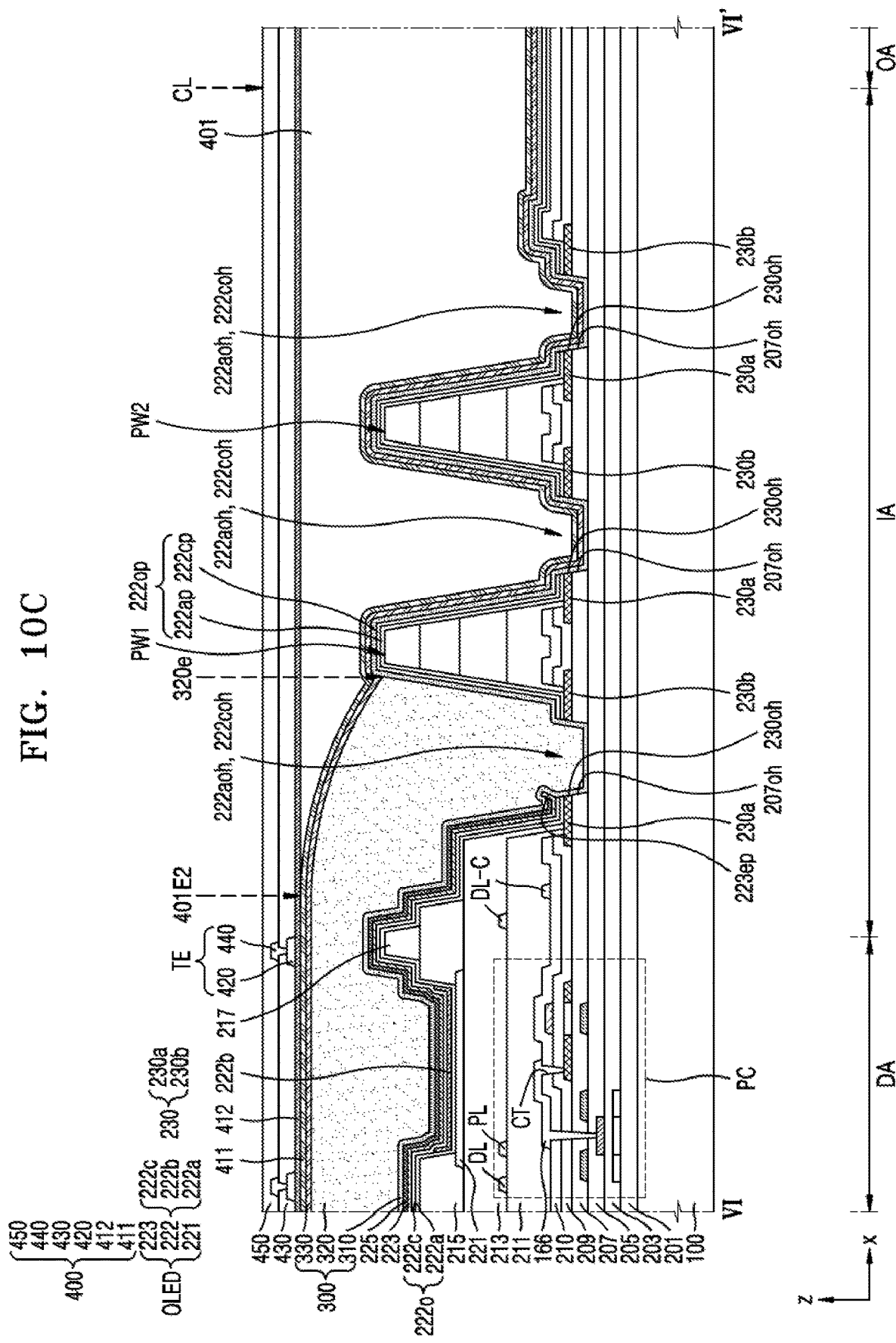

A portion of the second electrode 223 arranged in the intermediate area IA and a portion of the capping layer 225 arranged in the intermediate area IA may be removed by the laser beam (through a laser lift-off process). Regarding the above, FIG. 10B shows a second opening portion 223oh of the second electrode 223 and a third opening portion 225oh of the capping layer 225, which are formed by removing a portion of the second electrode 223 and a portion of the capping layer 225 arranged in the intermediate area IA. Each of the second opening portion 223oh of the second electrode 223 and the third opening portion 225oh of the capping layer 225 may be a single opening portion arranged in the intermediate area IA. The first opening portion 223oh and the second opening portion 225oh may surround the opening area OA.

In an embodiment, an edge portion 223ep of the second electrode 223 may be arranged between the display area DA and the first partition wall PW1, the edge portion 223ep defining an outline of the second opening portion 223oh. An edge of the capping layer 225 may be arranged on the edge portion 223ep of the second electrode 223, the edge defining an outline of the third opening portion 225oh. The outlines of the second opening portion 223oh and the third opening portion 225oh may be closer to the display area DA than the first partition wall PW1. In other words, the first and second partition walls PW1 and PW2 may be arranged in the second opening portion 223oh and the third opening portion 225oh.

During the laser lift-off process described above, the sacrificial layer 1200 may absorb the laser beam and be heated to a certain temperature, and layers arranged above the sacrificial layer 1200 may be removed together with the sacrificial layer 1200. According to the embodiments of the present disclosure, because the sacrificial layer 1200 is formed in the process of forming the pixel circuit PC described above, without an additional mask process for forming the sacrificial layer 1200, a portion of at least one insulating layer arranged on the sacrificial layer 1200 may be removed together with the sacrificial layer 1200. For example, a portion of the second interlayer insulating layer 207, a portion of the stopper layer 230, a portion of the organic material layer 222o (specifically, a portion of the first functional layer 222a and a portion of the second interlayer insulating layer 207), which are arranged above the sacrificial layer 1200, may also be removed. FIG. 10B shows first opening portions 222oh of the organic material layer 222o, opening portions 230oh of the stopper layer 230, and opening portions 207oh of the second interlayer insulating layer 207, the opening portion 230oh and the opening portion 207oh being below the first opening portion 222oh.

When the organic material layer 222o includes the first and second functional layers 222a and 222c, the first opening portion 222oh of the organic material layer 222o may overlap an opening portion 222aoh of the first functional layer 222a and an opening portion 222coh of the second functional layer 222c. The stopper layer 230 may include a first portion 230a and a second portion 230b arranged at opposite sides of the opening portion 230oh.

Separation portions 222op may be separated by the first opening portions 222oh of the organic material layer 222o. When the organic material layer 222o includes the first and second functional layers 222a and 222c, the separation portion 222op may include a separation portion 222ap of the first functional layer 222a and a separation portion 222cp of the second functional layer 222c. The separation portion 222op of the organic material layer 222o may be apart from each other by the first opening portion 222oh. The first opening portions 222oh may be arranged at opposite sides of each of the first and second partition walls PW1 and PW2. The first and second partition walls PW1 and PW2 may be covered by separation portions 222op, for example, the separation portion 222ap of the first functional layer 222a and the separation portion 222cp of the second functional layer 222c.

Referring to FIG. 10O, an encapsulation layer 300 and an input sensing layer 400 may be provided on the structure described with reference to FIG. 10B.

A first inorganic encapsulation layer 310 of the encapsulation layer 300 may entirely cover the substrate 100. The first inorganic encapsulation layer 310 may be provided through chemical vapor deposition or the like. Because the sacrificial layer 1200 is removed in the laser lift-off process described above, the first inorganic encapsulation layer 310 may directly contact an upper surface of the first interlayer insulating layer 205 exposed through the opening portion 207oh of the second interlayer insulating layer 207.

Because the first inorganic encapsulation layer 310 has relatively excellent step coverage, the first inorganic encapsulation layer 310 may cover the edge portion 223ep of the second electrode 223. Even when the first inorganic encapsulation layer 310 covers the edge portion 223ep of the second electrode 223 as described above with reference to FIG. 7, there is a relatively high possibility of cracks occurring around the edge portion 223ep, but because the edge portion 223ep of the second 223 is covered by an organic encapsulation layer 320, unwanted cracks may be minimized or prevented.

The organic encapsulation layer 320 may be formed by applying a monomer through an inkjet method, and then curing the monomer, and the organic encapsulation layer 320 may include a resin provided as the monomer is cured. A specific material of the organic encapsulation layer 320 may be the same as that described above.

A second inorganic encapsulation layer 330 may be provided on the organic encapsulation layer 320 through chemical vapor deposition or the like. The second inorganic encapsulation layer 330 may directly contact the first inorganic encapsulation layer 310 in a portion of the intermediate area IA where the organic encapsulation layer 320 is not provided and in the opening area OA. For example, the second inorganic encapsulation layer 330 may directly contact the first inorganic encapsulation layer 310 between an edge 320e of the organic encapsulation layer 320 and the opening area OA; thus, moisture permeation may be minimized or prevented.

Subsequently, a first touch insulating layer 411 may be provided, and a planarization insulating layer 401 may be provided above the first touch insulating layer 411. The planarization insulating layer 401 may be provided in the intermediate area IA and the opening area OA. The planarization insulating layer 401 may not cover the display area DA. During the manufacturing process shown in FIG. 100, the planarization insulating layer 401 may be present only in the intermediate area IA and the opening area OA. Next, a second touch insulating layer 412, a third touch insulating layer 430, and a fourth touch insulating layer 450 may be provided.

Figure 10D:
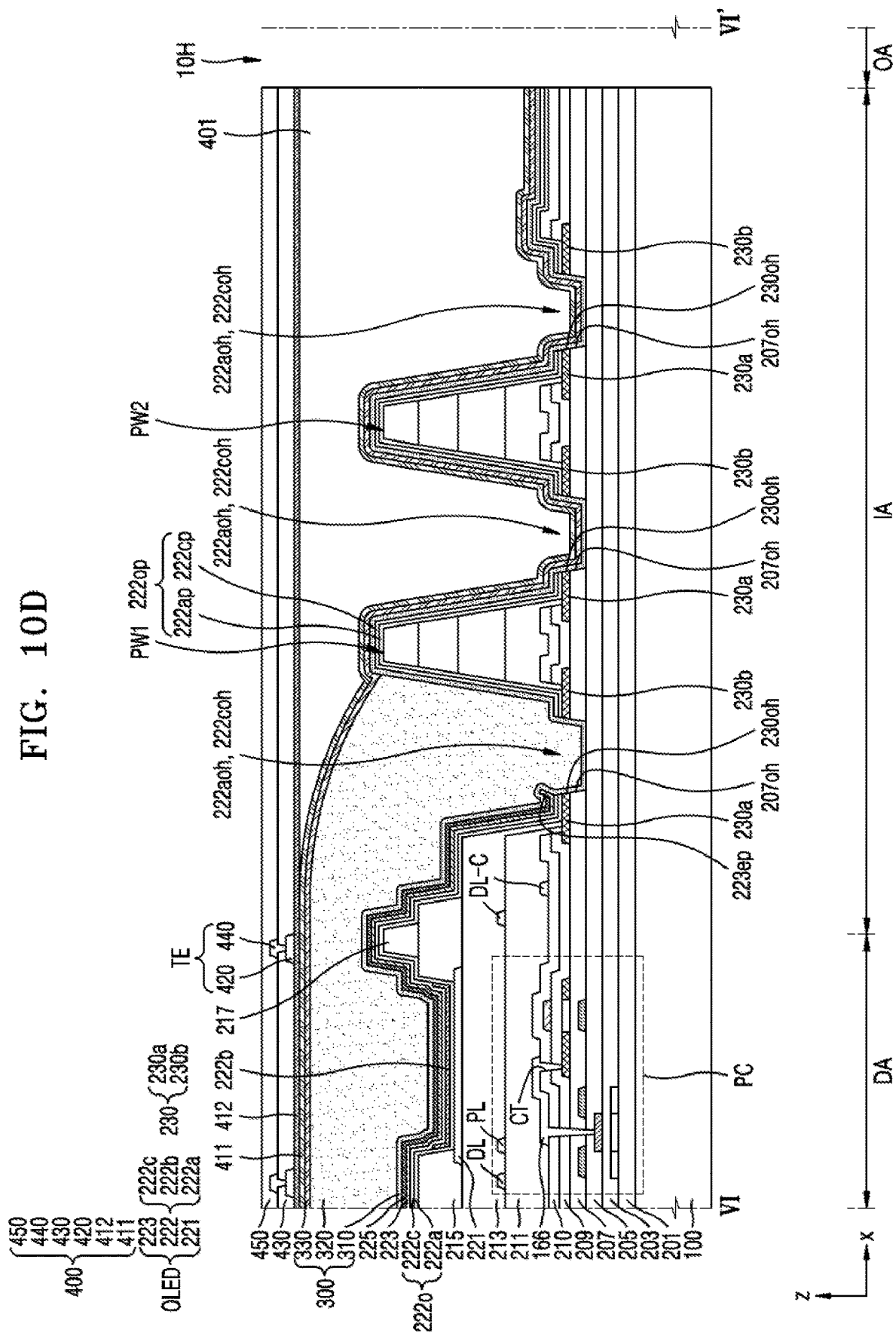

Subsequently, referring to FIG. 100 and FIG. 10D, the opening area OA is cut along a cutting line CL using laser cutting or the like, such that the display panel 10 may include an opening 10H in the opening area OA.

With reference to FIGS. 10A to 10D, the sacrificial layer 1200 may be provided in the same process as the upper electrode CE2 of the storage capacitor Cst. Accordingly, the sacrificial layer 1200 includes the same material and is arranged on the same layer as the upper electrode CE2 of the storage capacitor Cst.

In another example, the sacrificial layer 1200 may be provided in the same process as the lower electrode CE1 (see FIG. 10A) of the storage capacitor Cst (see FIG. 10A) and/or the first gate electrode GE1 (see FIG. 10A) of the first transistor T1 (see FIG. 10A). For example, the sacrificial layer 1200 may be arranged directly on the same layer (e.g., the first gate insulating layer 203) as the lower electrode CE1 of the storage capacitor Cst and/or the first gate electrode GE1 of the first transistor T1. The sacrificial layer 1200 may be removed as described above with reference to FIG. 10B to form a structure illustrated in FIG. 11.

Figure 11:
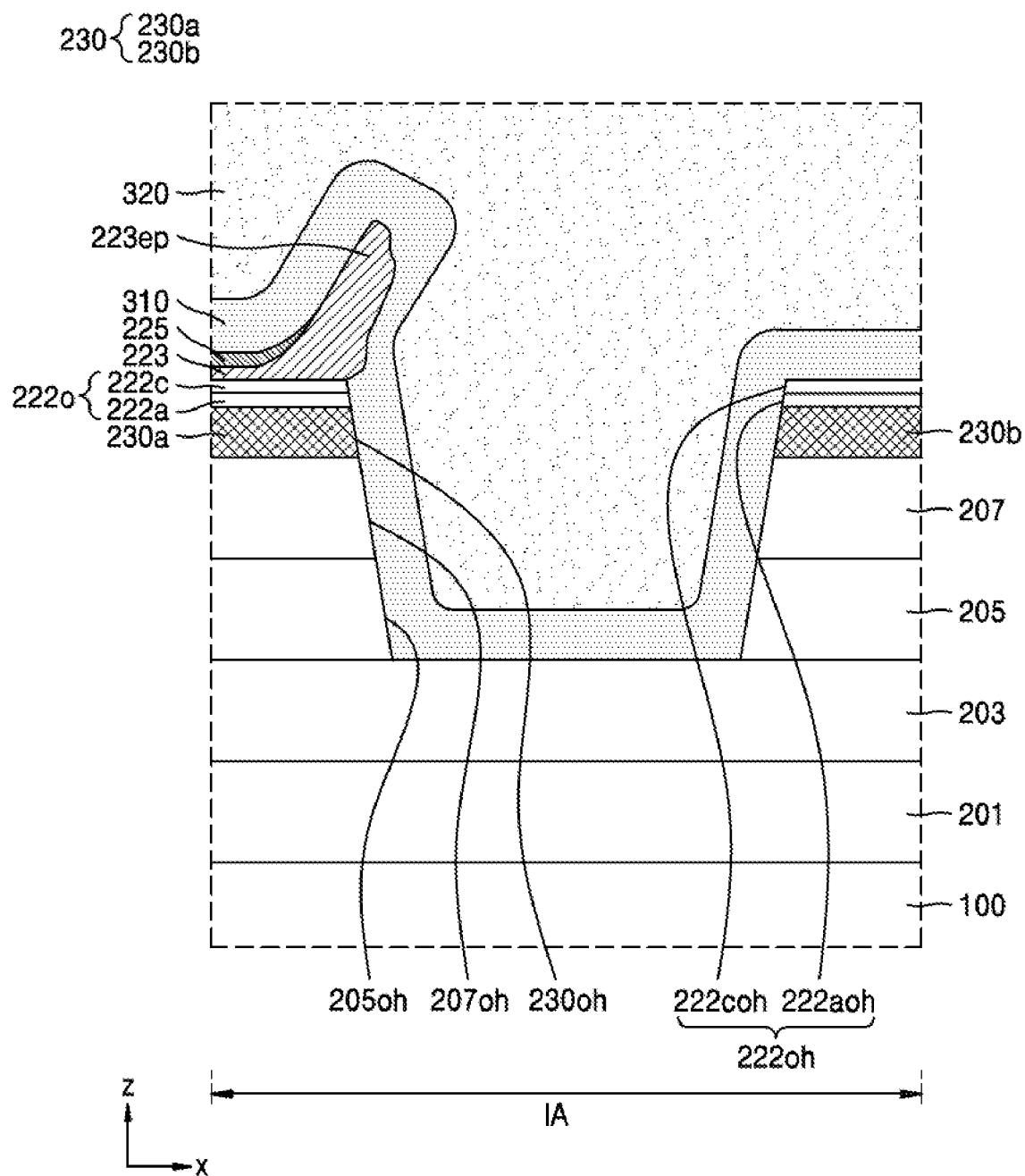
FIG. 11 is a cross-sectional view of an area around a first opening portion of an organic material layer of a display panel according to an embodiment.

FIG. 11 is a cross-sectional view of a structure around a first opening portion 222oh of an organic material layer 2220 of a display panel according to another embodiment. FIG. 11 may correspond to a modified example of FIG. 7.

Referring to FIG. 11, the first opening portion 222oh of the organic material layer 222o may overlap (and expose) a stopper layer 230 arranged below the organic material layer 222o and an opening provided in at least one insulating layer. The stopper layer 230 arranged below the organic material layer 222o may include an opening portion 230oh overlapping the first opening portion 222oh. A second interlayer insulating layer 207 and a first interlayer insulating layer 205 may be arranged below the stopper layer 230. The second interlayer insulating layer 207 and the first interlayer insulating layer 205 may include opening portions 207oh and 205oh, respectively, the opening portions 207oh and 205oh overlapping the first opening portion 222oh.

The organic material layer 222o may include a first functional layer 222a and a second functional layer 222c. In this case, as described above, an opening portion 222aoh of the first functional layer 222a and an opening portion 222coh of the second functional layer 222c may overlap each other to constitute the first opening portion 222oh.

The stopper layer 230 may include a first portion 230a and a second portion 230b at opposite sides of the opening portion 230oh. Separation portions of the organic material layer 222o arranged at opposite sides of the first opening portion 222oh may be arranged above the first portion 230a and second portion 230b of the stopper layer 230, respectively.

A first inorganic encapsulation layer 310 may directly contact a first gate insulating layer 203 through the first opening portion 222oh of the organic material layer 222o, the third opening portion 230oh of the stopper layer 230, and the opening portions 207oh and 205oh of the second interlayer insulating layer 207 and the first interlayer insulating layer 205. As described above with reference to FIG. 7, the first inorganic encapsulation layer 310 may cover the edge portion 223ep of the second electrode 223.

FIGS. 12A to 12E are cross-sectional views illustrating structures formed in a manufacturing process of a display panel according to another embodiment.

Figure 12A:
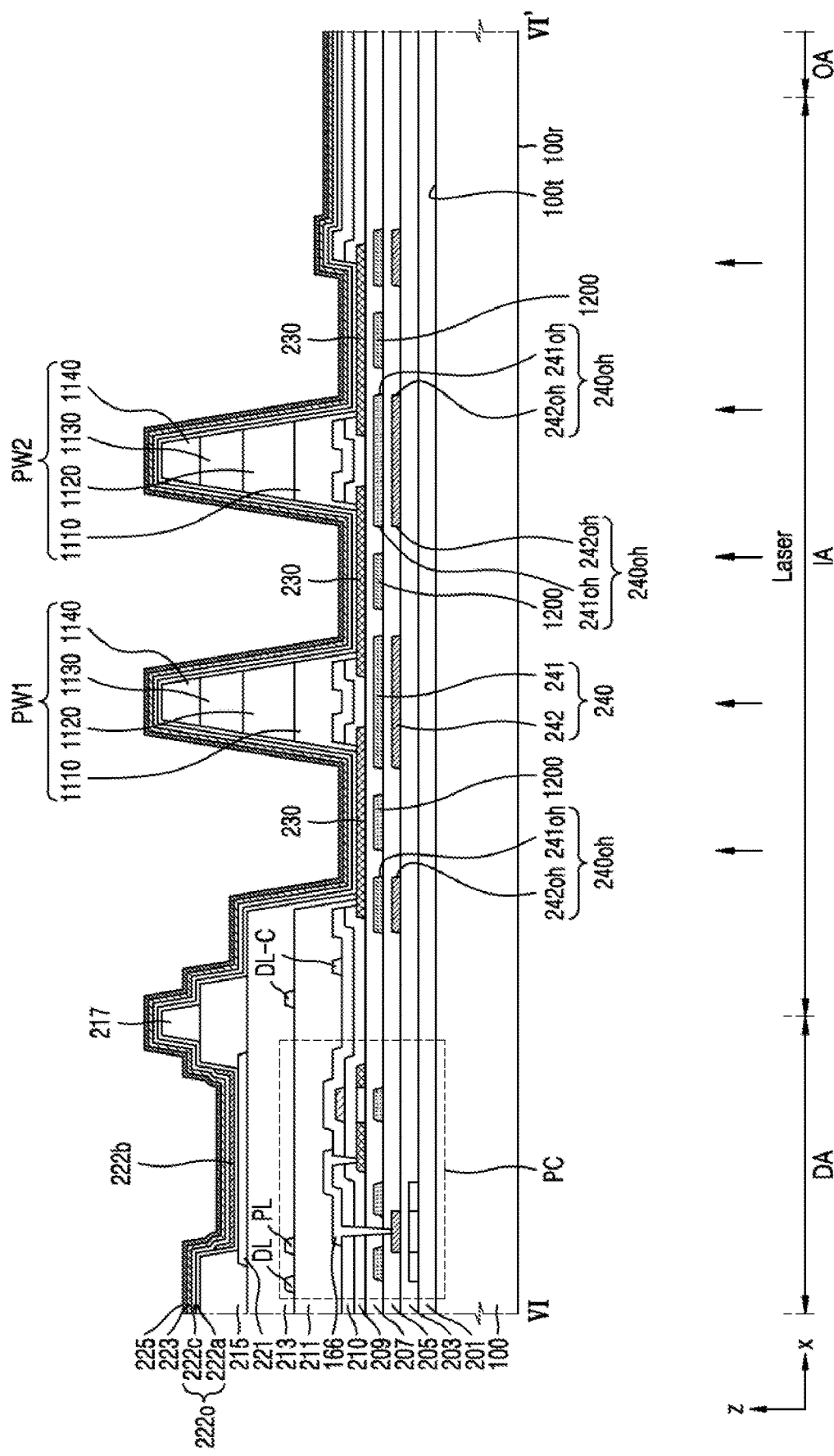
FIG. 12A, FIG. 12B, FIG. 12C, FIG. 12D, and FIG. 12E are cross-sectional views of structures formed in a manufacturing process of a display panel according to an embodiment.

Referring to FIG. 12A, a process of forming a metal stack 240 arranged around the sacrificial layer 1200 may be further included in the process described above with reference to FIG. 10A. The metal stack 240 may include a plurality of metal layers that are arranged directly on different insulating layers and overlap each other. FIG. 12A shows that the metal stack 240 includes a first metal layer 241 and a second metal layer 242. The metal stack 240 may include three or more metal layers.

One of the first metal layer 241 and the second metal layer 242 may be arranged directly on the same insulating layer as the sacrificial layer 1200, and the other one may be arranged directly on a different insulating layer from the sacrificial layer 1200. In an embodiment, similarly to the sacrificial layer 1200, the first metal layer 241 may be directly arranged on the first interlayer insulating layer 205 and may be provided/formed with the sacrificial layer 1200 in the same process. The first metal layer 241 may include the same material as the sacrificial layer 1200. The second metal layer 242 may be provided before the sacrificial layer 1200 is provided. The second metal layer 242 may be arranged directly on the same first gate insulating layer 203 in the same process as the first gate electrode GE1 of the first transistor T1. The second metal layer 242 may include the same material as the first gate electrode GE1.

The metal stack 240 may include an opening portion 240oh corresponding to the sacrificial layer 1200. Regarding the above, FIG. 12A shows that the first metal layer 241 and the second metal layer 242 include opening portions 241oh and 242oh, respectively. The opening portion 241oh of the first metal layer 241 and the opening portion 242oh of the second metal layer 242 may overlap the sacrificial layer 1200, and the opening portion 241oh of the first metal layer 241 and the opening portion 242oh of the second metal layer 242 overlapping each other may constitute the opening portion 242oh of the metal stack 240.

The stopper layer 230 may be provided after the sacrificial layer 1200 and the metal stack 240 are provided, and the first partition wall PW1 and the second partition wall PW2 may be provided above the stopper layer 230.

In the display area DA, the first functional layer 222a, the emission layer 222b, the second functional layer 222c, the second electrode 223, and the capping layer 225 may be provided on the first electrode 221. Unlike the emission layer 222b, the first functional layer 222a, the second functional layer 222c, the second electrode 223, and the capping layer 225 may entirely cover the substrate 100, and a laser beam may be irradiated through the rear surface 100r of the substrate 100 and subsequently through the upper surface 100t.

The laser of FIG. 12A may be different (in type, output, size, and/or irradiation range) from the laser described above with reference to FIG. 10A. In some embodiments, the number and time of laser irradiation may be reduced, compared with the process described above with reference to FIG. 10A.

Portions of layers arranged above the sacrificial layer 1200 may be removed by the laser (through a laser lift-off process) to form the first opening portions 222oh of the organic material layer 222o, the second opening portions 223oh of the second electrode 223, and the third opening portions 225oh of the capping layer 225. The first opening portion 222oh, the second opening portion 223oh, and the third opening portion 225oh may overlap each other and may be positioned above the opening portion 207oh of the second interlayer insulating layer 207 and the opening portion 230oh of the stopper layer 230 illustrated in FIG. 12B. The stopper layer 230 may include the first portion 230a and the second portion 230b at opposite sides of the opening portion 230oh. The sacrificial layer 1200 may be removed during the laser lift-off process, and regarding this, FIG. 12A shows that the opening portion 207oh is provided in the second interlayer insulating layer 207.

Figure 12B:
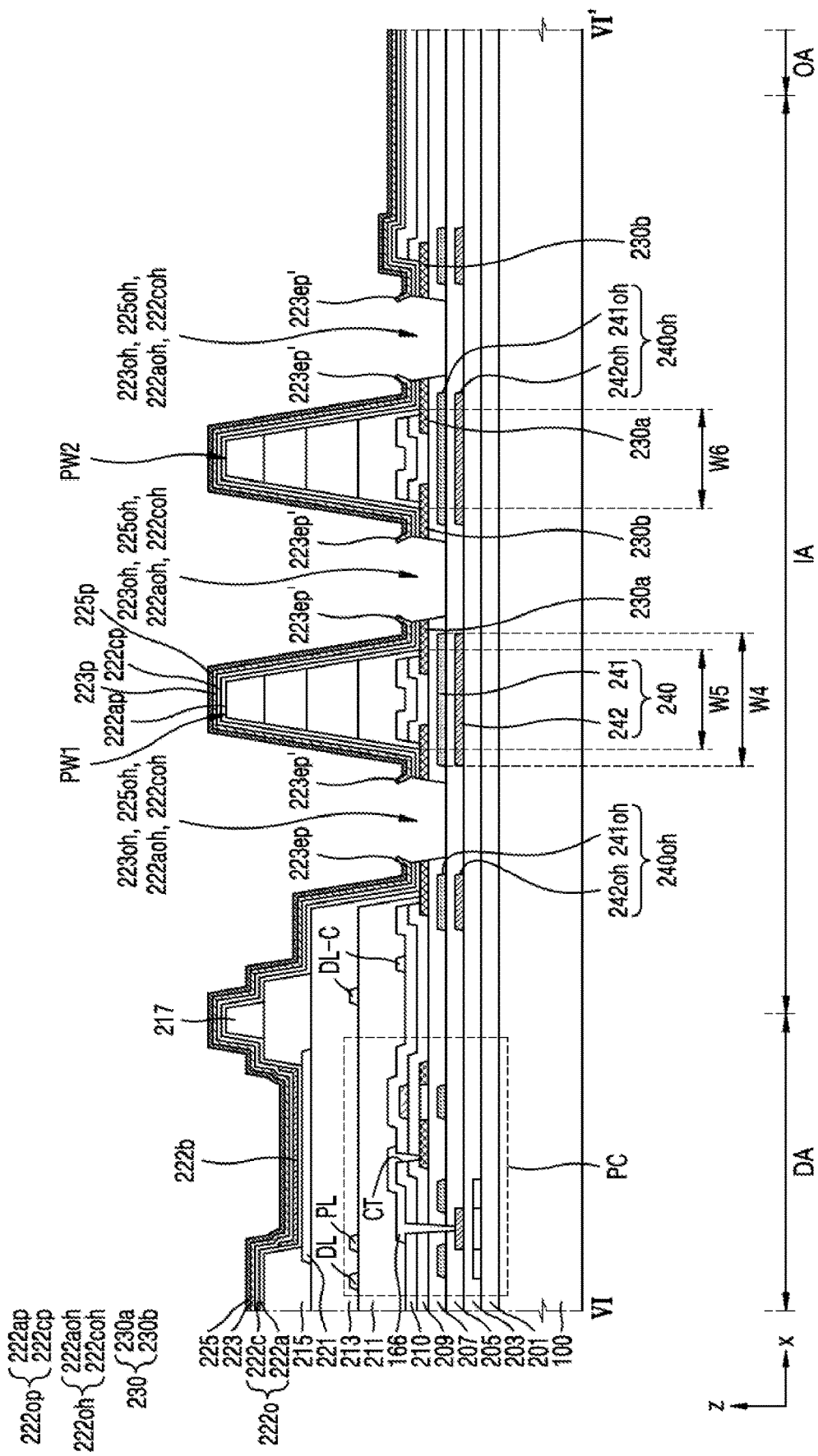

When the organic material layer 222o includes the first and second functional layers 222a and 222c, the first opening portion 222oh of the organic material layer 222o may include the opening portion 222aoh of the first functional layer 222a and the opening portion 222coh of the second functional layer 222c. The organic material layer 222o may include separation portions 222op separated from each other by the first opening portions 222oh in the intermediate area IA. As shown in FIG. 12B, each of the separation portions 222op of the organic material layer 222o may include the separation portion 222ap of the first functional layer 222a and the separation portion 222cp of the second functional layer 222c and may cover one of the first and second partition walls PW1 and PW2, respectively.

The first opening portions 222oh of the organic material layer 222o may be spaced from each other in the intermediate area IA. One first opening portion 222oh may be arranged between the display area DA and the first partition wall PW1, another first opening portion 222oh may be arranged between the first partition wall PW1 and the second partition wall PW2, and another first opening portion 222oh may be arranged between the second partition wall PW2 and the opening area OA.

When the time and number of laser irradiation is relatively reduced in the laser lift-off process associated with FIG. 12A, unlike that shown in FIG. 10B, a portion of the second electrode 223 and a portion of the capping layer 225 may be present above each of the first partition wall PW1 and the second partition wall PW2.

During the laser lift-off process described with reference to FIG. 12A, the laser beam irradiated to the substrate 100 may be irradiated not only to the sacrificial layer 1200, but also to the metal stack 240, for example, the first and second metal layers 241 and 242.

The metal stack 240 includes a plurality of metal layers and may have a function different from that of the sacrificial layer 1200. For example, the metal stack 240 may prevent the laser beam from progressing toward the first and second partition walls PW1 and PW2 arranged above the metal stack 240. Accordingly, a separation portion 223p of the second electrode 223 and a separation portion 225p of the capping layer 225 present above the metal stack 240 may not be removed.

The second electrode 223 may include the separation portions 223p that are separated by the second opening portion 223oh in the intermediate area IA. Similarly, the capping layer 225 may also include separation portions 225p that are separated by the third opening portion 225oh in the intermediate area IA. The separation portions 223p of the second electrode 223 and the separation portions 225p of the capping layer 225 may have substantially the same pattern as the separation portions 222op of the organic material layer 222o, and may be arranged on the separation portions 222op of the organic material layer 222o.

The edge portion 223ep of the second electrode 223 and/or edge portions 223ep' of the separation portion 223p arranged at opposite sides of the second opening portion 223oh may have irregular shapes (like the edge portion 223ep of the second electrode 223 described above with reference to FIG. 7).

Positions of the edge portions 223ep' of the separation portion 223p may be changed according to an amount of laser beam blocked by the metal stack 240. For using a laser beam projected in the z direction perpendicular to the lower surface 100r of the substrate 100, a width W4 of a portion of the metal stack 240 may be greater than each of widths W5 and W6 of the first and second partition walls PW1 and PW2.

In a comparative example, when the width W4 of a portion of the metal stack 240 overlapping the first and second partition walls PW1 and PW2 is less than each of the widths W5 and W6 of the first and second partition walls PW1 and PW2, a laser beam may remove the second electrode 223. As a result, edge portions 223ep' of the separation portion 223p of the second electrode 223 may be positioned on sides of the first and second partition walls PW1 and PW2. Consequently, significant cracks may occur due to the irregular shapes of the edge portions 223ep'.

Figure 12C:
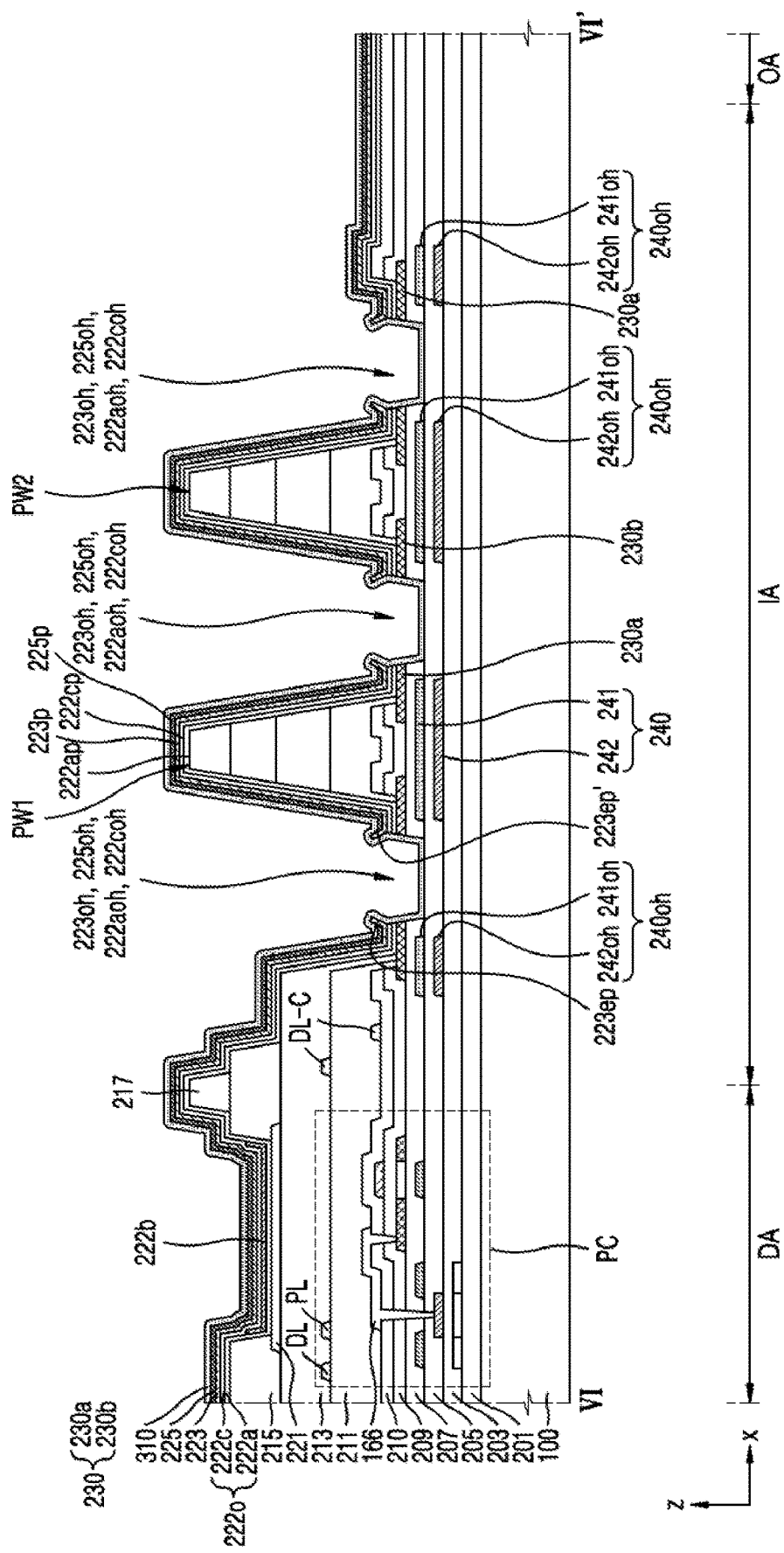

However, as in the embodiments, when the width W4 of a portion of the metal stack 240 arranged between adjacent opening portions 240oh is greater than each of the widths W5 and W6 of the first partition wall PW1 and the second partition wall PW2, the edge portions 223ep' may be controlled to be at desired positions, and as shown in FIG. 12C to be described later, a process of covering the edge portions 223ep' by using a layer including an organic insulating layer may be performed.

The metal stack 240 may include the first metal layer 241 and the second metal layer 242, and in an embodiment, FIG. 12B shows that a width of a portion of the first metal layer 241 between adjacent opening portions 241oh and a width of a portion of the second metal layer 242 between adjacent opening portions 242oh have the same width, for example, the width W4. However, the present disclosure is not limited thereto.

In another embodiment, a portion of any one selected from among the first metal layer 241 and the second metal layer 242 included in the metal stack 240 may be provided to have the width W4 described above. For example, the width of a portion of the first metal layer 241 between the adjacent opening portions 241oh may be less than the width of the corresponding one of the first partition wall PW1 and the second partition wall PW2, and the width of a portion of the second metal layer 242 between the adjacent opening portions 242oh may be greater than the width of the corresponding one of the first partition wall PW1 and the second partition wall PW2. In another embodiment, the width of a portion of the first metal layer 241 between the adjacent opening portions 241oh may be greater than the width of the corresponding one of the first partition wall PW1 and the second partition wall PW2, and the width of a portion of the second metal layer 242 between the adjacent opening portions 242oh may be less than the width of the corresponding one of the first partition wall PW1 and the second partition wall PW2.

Referring to FIG. 12C, the first inorganic encapsulation layer 310 may be provided on the structure described above with reference to FIG. 12B.

The first inorganic encapsulation layer 310 may entirely cover the substrate 100. Because the first inorganic encapsulation layer 310 has relatively excellent step coverage, the first inorganic encapsulation layer 310 may cover the edge portion 223ep of the second electrode 223 and the edge portions 223ep' of the separation portion 223p. Because the edge portions 223ep and 223ep' are burrs having irregular shapes, even when the first inorganic encapsulation layer 310 covers a portion (for example, the edge portion 223ep) of the second electrode 223, a probability of occurrence of cracks may be relatively high. However, referring to FIG. 12D, the edge portions 223ep and 223ep' are covered by an organic insulating material layer, such that cracks may be minimized or prevented. The first inorganic encapsulation layer 310 may directly contact the first interlayer insulating layer 205.

Figure 12D:
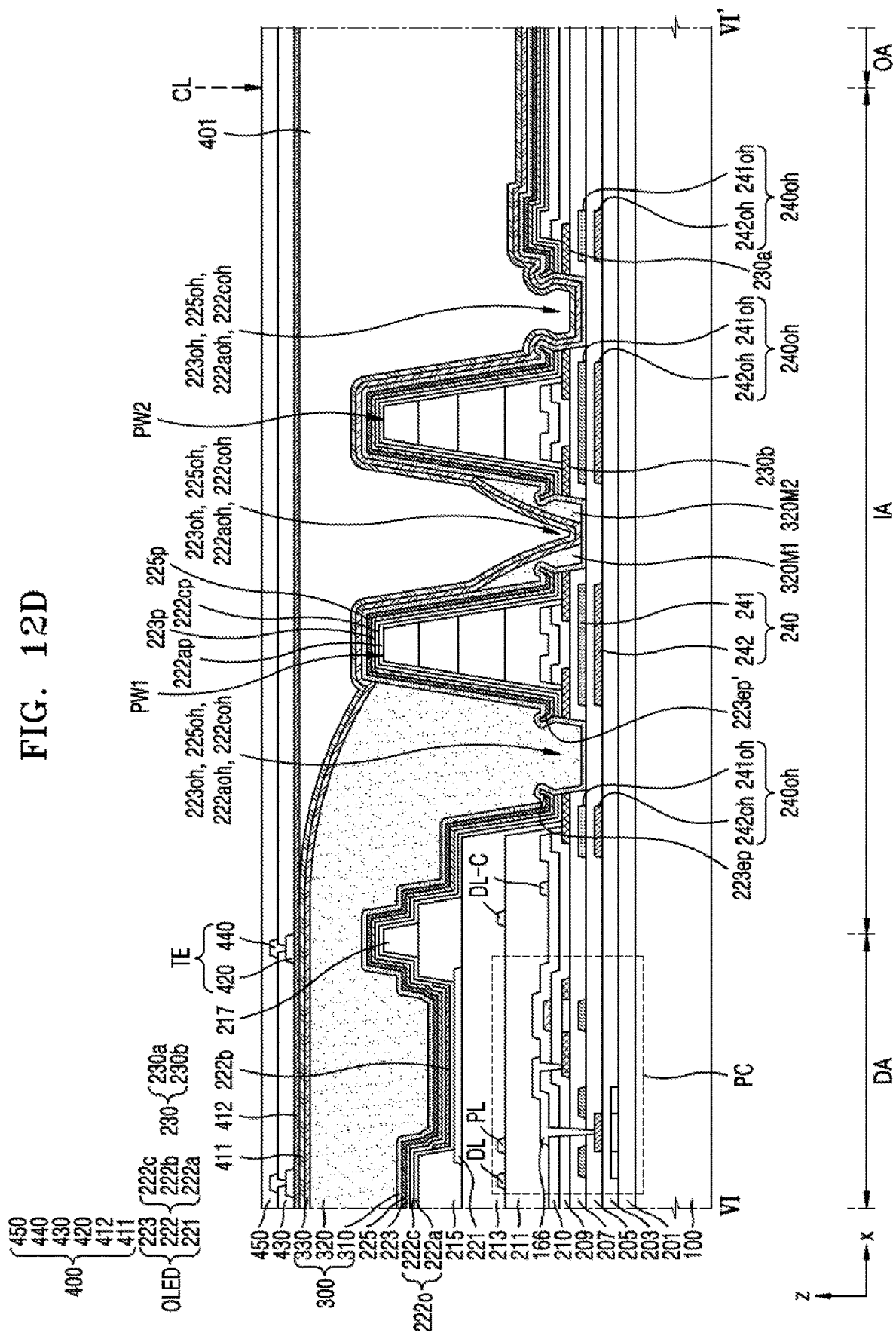

Referring to FIG. 12D, the organic encapsulation layer 320 and the second inorganic encapsulation layer 330 may be provided on the first inorganic encapsulation layer 310, and the input sensing layer 400 and the planarization insulating layer 401 may be provided on the encapsulation layer 300. The encapsulation layer 300 includes the first inorganic encapsulation layer 310, the organic encapsulation layer 320, and the second inorganic encapsulation layer 330. A process of forming the encapsulation layer 300, the input sensing layer 400, and the planarization insulating layer 401 is as described above with reference to FIG. 100, and a process of forming the organic encapsulation layer 320 in the embodiment shown in FIG. 12D is different from the process described above with reference to FIG. 100.

Most of organic insulating material(s) may cover the display area DA in the process of forming the organic encapsulation layer 320, but some of the organic insulating material(s) may move to the space between the first partition wall PW1 and the second partition wall PW2. FIG. 12D shows first and second organic insulating material portions/members 320M1 and 320M2 arranged between the first partition wall PW1 and the second partition wall PW2. The first and second organic insulating material portions 320M1 and 320M2 may each include the same material as the organic encapsulation layer 320.

The organic encapsulation layer 320 may overlap and cover the edge portion 223ep of the second electrode 223 arranged between the display area DA and the first partition wall PW1, and may cover the edge portion 223ep' on one side of a separation portion of the second electrode 223 arranged on the first partition wall PW1. Similarly, the first and second organic insulating material portions 320M1 and 320M2 may cover the edge portions 223ep' between the first and second partition walls PW1 and PW2.

The first and second organic insulating material portions 320M1 and 320M2 may be spaced from each other. The first organic insulating material portion 320M1 may be arranged at one side of the first partition wall PW1 facing the second partition wall PW2. The second organic insulating material portion 320M2 may be arranged on one side of the second partition wall PW2 facing the first partition wall PW1.

FIG. 12D shows the first and second organic insulating material portions 320M1 and 320M2 arranged between the first partition wall PW1 and the second partition wall PW2, but the present disclosure is not limited thereto. In another embodiment, At least one of the first and second organic insulating material portions 320M1 and 320M2 may be optional.

After the structure shown in FIG. 12D is provided, portions of layers arranged in the opening area OA may be removed along a cutting line CL by, for example, laser cutting. As a result, the opening 10H of the display panel 10 arranged in the opening area OA may be provided, as shown in FIG. 12E.

Figure 12E:
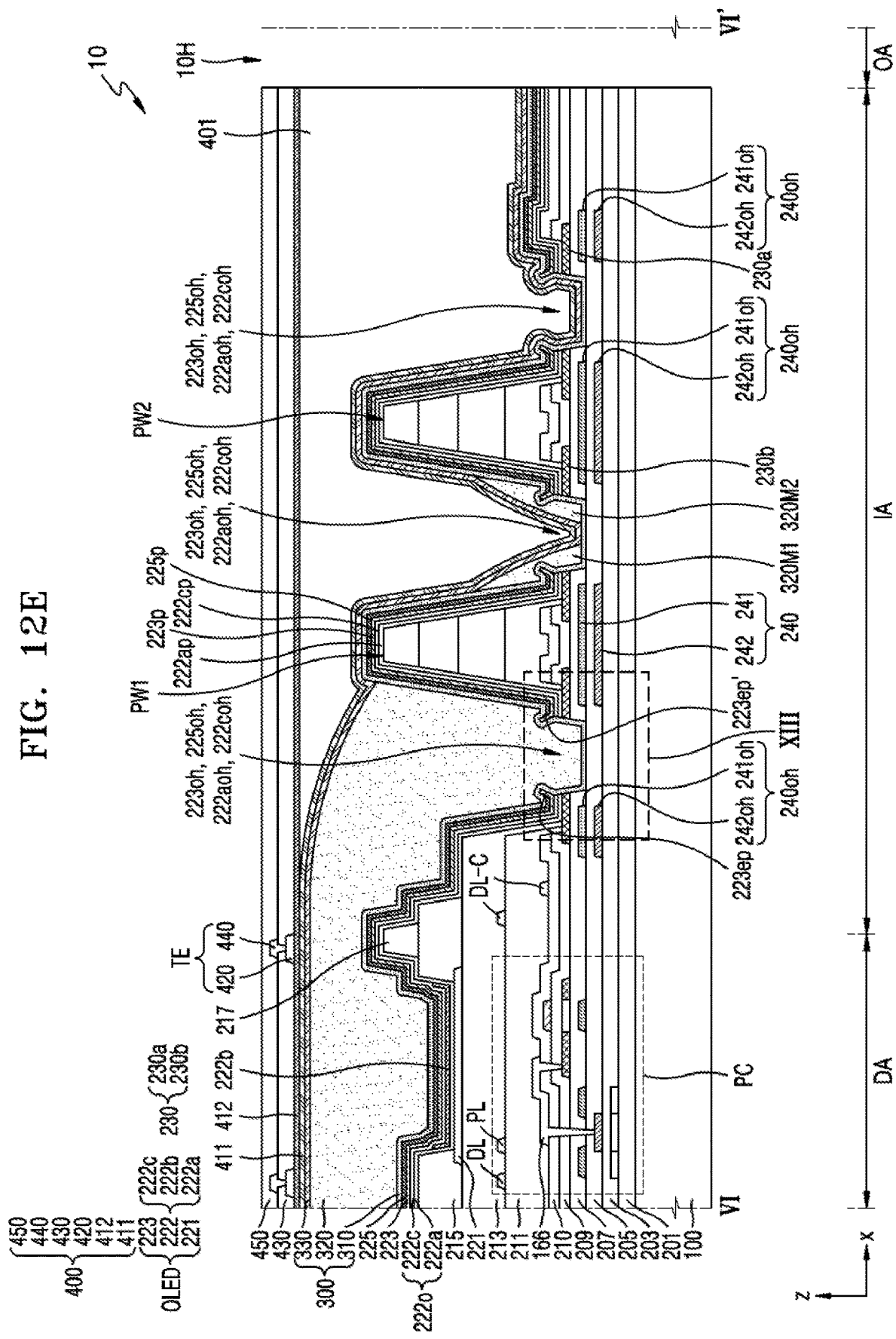
Figure 13:
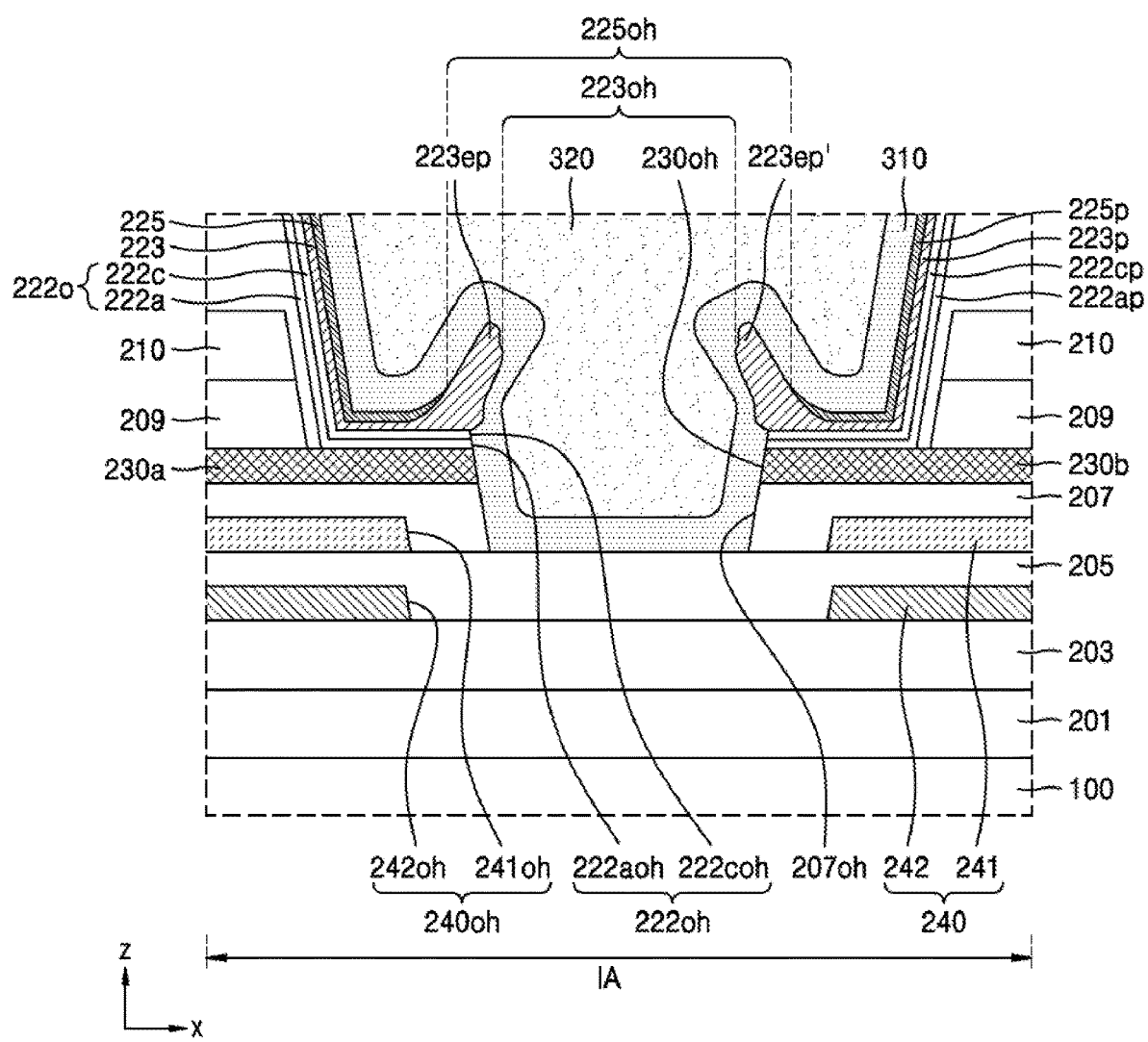
FIG. 13 schematically illustrates the XIII region (or region XIII) in FIG. 12E.

FIG. 13 schematically illustrates the region XIII shown in FIG. 12E. Referring to FIG. 13, the first opening portion 222oh of the organic material layer 222o may overlap the opening portion 230oh of the stopper layer 230 arranged below the organic material layer 222o, and the opening portion 230oh of the stopper layer 230 may overlap the opening portion 207oh of the second interlayer insulating layer 207 arranged below the stopper layer 230. Separation portions of the organic material layer 222o arranged at opposite sides of the first opening portion 222oh may be arranged on the first portion 230a and second portion 230b of the stopper layer 230. The organic material layer 222o may include the first functional layer 222a and the second functional layer 222c. The opening portion 222aoh of the first functional layer 222a and the opening portion 222coh of the second functional layer 222c may overlap each other and constitute the first opening portion 222oh described above.

The second electrode 223 may include the second opening portion 223oh overlapping the first opening portion 222oh, and the capping layer 225 may include the third opening portion 225oh overlapping the first opening portion 222oh. The edge portion 223ep of the second electrode 223 and the edge portion 223ep' of the separation portion 223p arranged at opposite sides of the second opening portion 223oh may be covered by the first inorganic encapsulation layer 310, may directly contact the first inorganic encapsulation layer 310, and may be covered by the organic encapsulation layer 320.

The opening portion 240oh of the metal stack 240 may overlap the opening portion 207oh of the second interlayer insulating layer 207. When the metal stack 240 includes the first metal layer 241 and the second metal layer 242, the opening portion 240oh of the metal stack 240 may include the opening portion 241oh of the first metal layer 241 and the opening portion 242oh of the second metal layer 242, which overlap each other. A width of the opening portion 241oh of the first metal layer 241 may be greater than a width of the opening portion 207oh of the second interlayer insulating layer 207, and the opening portion 207oh of the second interlayer insulating layer 207 may be arranged in the opening portion 241oh of the first metal layer 241. A width of the opening portion 242oh of the second metal layer 242 may be greater than the width of the opening portion 207oh of the second interlayer insulating layer 207.

The first inorganic encapsulation layer 310 may directly contact the first interlayer insulating layer 205 through the first to third opening portions 222oh, 223oh, and 225oh, the opening portion 230oh of the stopper layer 230, and the opening portion 207oh of the second interlayer insulating layer 207.

Figure 14:
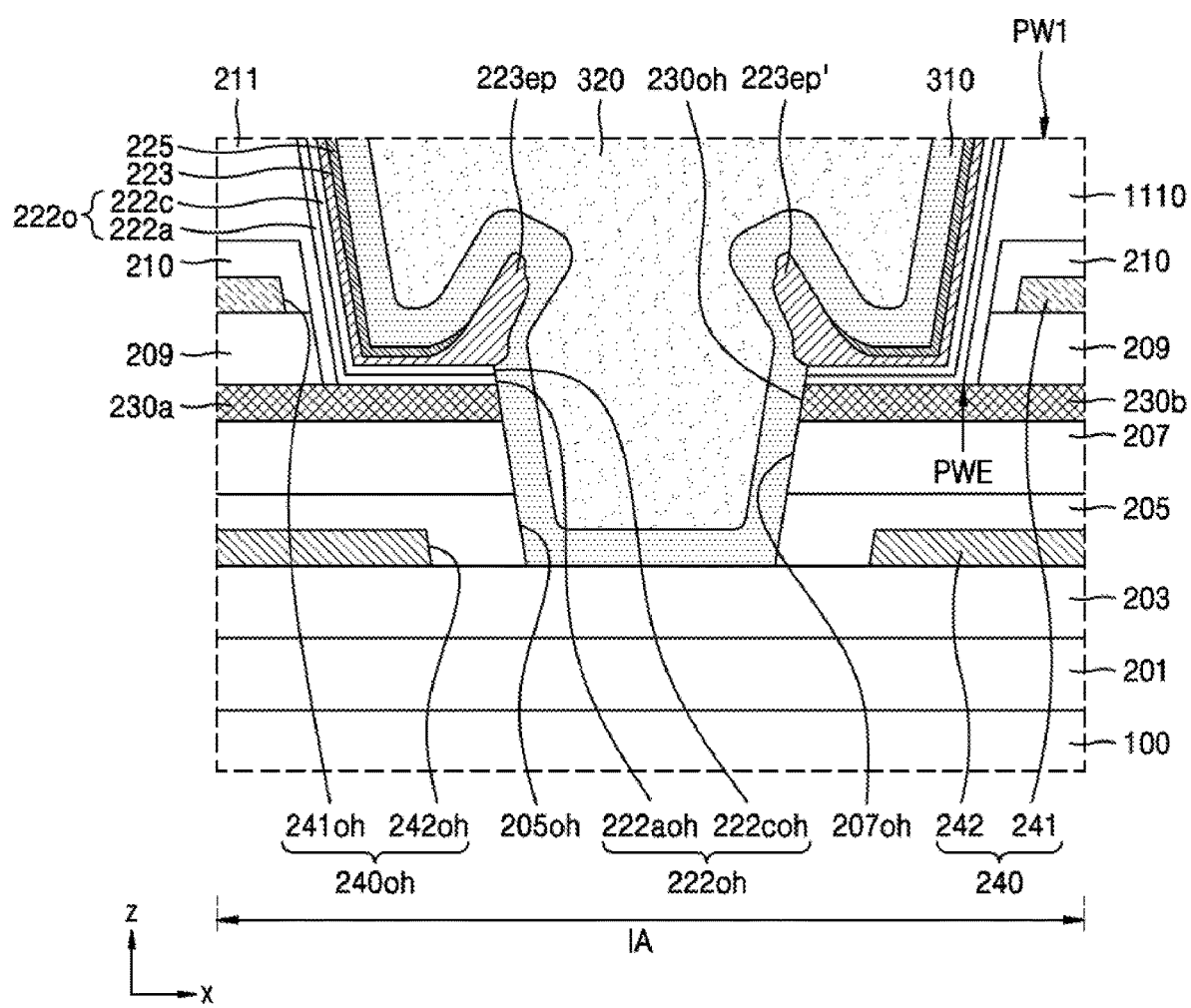
FIG. 14 is a cross-sectional view of an area around a first opening portion of an organic material layer of a display panel according to an embodiment.

FIG. 14 is a cross-sectional view of a structure around the first opening portion 222oh of the organic material layer 222o of a display panel according to an embodiment. FIG. 14 includes some structures described above with reference to FIG. 13 and some different structures. Referring to FIG. 14, an opening portion 205oh may be formed in the first interlayer insulating layer 205, and positions of metal layers included in the metal stack 240 may be different from those illustrated in FIG. 13.

Referring to FIGS. 12A to 12E, the sacrificial layer 1200 includes the same material and is formed on the same layer as the upper electrode CE2 of the storage capacitor Cst, and thus the opening portion 207oh is provided in the second interlayer insulating layer 207 arranged on the sacrificial layer 1200. In another embodiment, the sacrificial layer 1200 may be formed in the same process as the lower electrode CE1 (see FIG. 10A) of the storage capacitor Cst (see FIG. 10A) and/or the first gate electrode GE1 (see FIG. 10A of the first transistor T1 (see FIG. 10A), and the opening portions 205oh and 207oh may be provided in the first interlayer insulating layer 205 and the second interlayer insulating layer 207, respectively.

The metal stack 240 may include a plurality of metal layers, and in an embodiment, FIG. 14 shows that the metal stack 240 includes the first metal layer 241 and a second metal layer 242, the first metal layer 241 being arranged above the stopper layer 230, and the second metal layer 242 being arranged below the stopper layer 230. The first metal layer 241 may be arranged directly on the second gate insulating layer 209, and the second metal layer 242 may be arranged directly on the first gate insulating layer 203.

The first metal layer 241 and the second metal layer 242 may respectively include the opening portions 241oh and 242oh overlapping the opening portion 230oh of the stopper layer 230. The opening portions 241oh and 242oh may differ in size. the opening portion 241oh of the first metal layer 241 may be larger in size than the opening portion 242oh of the second metal layer 242.

The first metal layer 241 may be covered by the first organic insulating layer 211 arranged on the third interlayer insulating layer 210 and/or the first sub-partition wall layer 1110 of the first partition wall PW1. A width of a portion of the first metal layer 241 overlapping the first partition wall PW1 may be less than a width of the first partition wall PW1, but a width of a portion of the second metal layer 242 overlapping the first partition wall PW1 may be greater than the width of the first partition wall PW1. The second metal layer 242 may extend beyond an edge PWE of the first partition wall PW1 in a horizontal direction (an x direction).

According to the embodiments of the present disclosure, unwanted moisture permeation and/or cracks in a display panel including an opening and an electronic device including the display panel may be advantageously prevented or minimized. According to embodiments, and there is an advantage in that the display panel and electronic device having the above-described structure may be manufactured without increasing the process.

The described embodiments should be considered in an illustrative sense and not for purposes of limitation. Description of features or aspects within each of the embodiments should typically be considered as available for similar features or aspects in other embodiments. Various changes in form and details may be made in the described embodiments without departing from the scope defined by the following claims.

What is claimed is:

1. A display panel comprising:
a substrate having an opening;
a plurality of light-emitting elements in a display area around the opening, the plurality of light-emitting elements comprising a first electrode, a second electrode, and an intermediate layer between the first electrode and the second electrode;
a plurality of partition walls in an intermediate area between the display area and the opening; and
at least one insulating layer positioned between the plurality of partition walls and the substrate,
wherein the intermediate layer further comprises an organic material layer extending toward the intermediate area from the display area, and the organic material layer is separated by a plurality of first opening portions in the intermediate area, and
the at least one insulating layer has a plurality of opening portions overlapping the plurality of first opening portions, and
wherein the second electrode includes an edge portion disposed between the display area and the plurality of partition wall, and the edge portion of the second electrode extends in an oblique direction away from an upper surface of the substrate.

2. The display panel of claim 1, further comprising: a stopper layer positioned between the organic material layer and the at least one insulating layer, the stopper layer having a plurality of opening portions corresponding to the first opening portions.

3. The display panel of claim 1, wherein the plurality of partition walls comprise a first partition wall and a second partition wall, the first partition wall being closest to the display area, and the second partition wall being closer to the opening of the substrate than the first partition wall.

4. The display panel of claim 3, wherein the second electrode comprises a single second opening portion extending toward the intermediate area from the display area and located in the intermediate area, and
the edge portion of the second electrode is located between the display area and the first partition wall, the edge portion of the second electrode defining an outline of the second opening portion.

5. The display panel of claim 4, further comprising an organic encapsulation layer on the plurality of light-emitting elements, the encapsulation layer including at least one inorganic encapsulation layer and an organic encapsulation layer, wherein the edge portion of the second electrode is covered by the organic encapsulation layer.

6. The display panel of claim 3, wherein the second electrode extends toward the intermediate area from the display area in the intermediate layer, the second electrode comprising a plurality of separation portions separated by a plurality of second opening portions in the intermediate area.

7. The display panel of claim 6, further comprising an encapsulation layer on the plurality of light-emitting elements, the encapsulation layer including at least one inorganic encapsulation layer and an organic encapsulation layer, wherein one edge portion of the plurality of separation portions is located between the first partition wall and the second partition wall, and overlaps an organic insulating material portion.

8. The display panel of claim 7, wherein the organic insulating material portion comprises a same material as the organic encapsulation layer.

9. The display panel of claim 1, further comprising a metal stack having an opening portion corresponding to the plurality of first opening portions.

10. The display panel of claim 9, wherein the metal stack comprises a plurality of metal layers on different layers from each other, and one of the plurality of metal layers is positioned between the insulating layer and the substrate.

11. An electronic apparatus comprising:
a display panel comprising an opening area, a display area around the opening area, and an intermediate area between the opening area and the display area; and
a component below the display panel to overlap the opening area,
wherein the display panel comprises:
a substrate having an opening in the opening area;

a plurality of light-emitting elements in the display area, the plurality of light-emitting elements comprising a first electrode, a second electrode, and an intermediate layer disposed between the first electrode and the second electrode and comprising an emission layer;

a first partition wall and a second partition wall in the intermediate area; and at least one insulating layer positioned between the first partition wall and the substrate, and between the second partition wall and the substrate, wherein the intermediate layer further comprises an organic material layer extending toward the intermediate area from the display area, and the organic material layer is separated by a plurality of first opening portions in the intermediate area, and the at least one insulating layer has a plurality of opening portions overlapping the plurality of first opening portions, and wherein the second electrode includes an edge portion disposed between the display area and one of the first partition wall and the second partition wall, and the edge portion of the second electrode extends in an oblique direction away from an upper surface of the substrate.

12. The electronic apparatus of claim 11, wherein the display panel further comprises: a stopper layer positioned between the organic material layer and the at least one insulating layer, the stopper layer having a plurality of opening portions corresponding to the first opening portions.

13. The electronic apparatus of claim 11, wherein the second electrode comprises a single second opening portion extending toward the intermediate area from the display area and located in the intermediate area, the first partition wall and the second partition wall are located in the single second opening portion, and the edge portion of the second electrode is located between the display area and the first partition wall, the edge portion of the second electrode defining an outline of the single second opening portion.

14. The electronic apparatus of claim 13, further comprising an encapsulation layer on the plurality of light-emitting elements, the encapsulation layer including at least one inorganic encapsulation layer and an organic encapsulation layer, wherein the edge portion of the second electrode is covered by the organic encapsulation layer.

15. The electronic apparatus of claim 11, wherein the second electrode extends toward the intermediate area from the display area in the intermediate layer, the second electrode comprising a plurality of separation portions separated by a plurality of second opening portions in the intermediate area.

16. The electronic apparatus of claim 15, wherein the plurality of separation portions of the second electrode cover each of the first partition wall and the second partition wall.

17. The electronic apparatus of claim 15, further comprising an encapsulation layer on the plurality of light-emitting elements, the encapsulation layer including at least one inorganic encapsulation layer and an organic encapsulation layer, wherein one edge portion of the plurality of separation portions of the second electrode is located between the first partition wall and the second partition wall, and overlaps an organic insulating material portion, the organic insulating material portion comprising a same material as the organic encapsulation layer.

18. The electronic apparatus of claim 15, wherein the display panel further comprises a metal stack in the intermediate layer, the metal stack comprising a plurality of metal layers arranged on different layers from each other, and the metal stack comprises opening portions corresponding to the plurality of first opening portions.

19. The electronic apparatus of claim 18, wherein one of the plurality of metal layers overlaps one of the first partition wall and the second partition wall, the one of the plurality of metal layers having a width greater than a width of the overlapping partition wall.

20. The electronic apparatus of claim 11, wherein the component comprises a speaker, a sensor, or a camera.

* * * * *